(12) United States Patent
Shinoda et al.

(10) Patent No.: US 11,664,448 B2
(45) Date of Patent: May 30, 2023

(54) SEMICONDUCTOR DEVICE

(71) Applicant: ROHM Co., Ltd., Kyoto (JP)

(72) Inventors: Tomoaki Shinoda, Kyoto (JP); Hajime Kataoka, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 200 days.

(21) Appl. No.: 17/323,500

(22) Filed: May 18, 2021

(65) Prior Publication Data

US 2021/0367071 A1 Nov. 25, 2021

(51) Int. Cl.
*H01L 29/78* (2006.01)
*H01L 29/423* (2006.01)
*H01L 23/522* (2006.01)
*H01L 27/088* (2006.01)
*H01L 29/66* (2006.01)

(52) U.S. Cl.
CPC ...... *H01L 29/7813* (2013.01); *H01L 23/5223* (2013.01); *H01L 27/088* (2013.01); *H01L 29/4236* (2013.01); *H01L 29/66734* (2013.01)

(58) Field of Classification Search
CPC ............. H01L 29/7813; H01L 29/4236; H01L 29/66734; H01L 27/088; H01L 23/5223

USPC ........................................................ 257/330
See application file for complete search history.

(56) References Cited

U.S. PATENT DOCUMENTS

| 2006/0001084 A1* | 1/2006 | Kelly | H01L 29/7813 |
| | | | 257/E29.264 |
| 2019/0081170 A1* | 3/2019 | Kumagai | H01L 27/088 |
| 2020/0303525 A1* | 9/2020 | Iwakaji | H01L 29/1095 |

FOREIGN PATENT DOCUMENTS

JP 2011199109 A 10/2011

* cited by examiner

*Primary Examiner* — Igwe U Anya
(74) *Attorney, Agent, or Firm* — Hamre, Schumann, Mueller & Larson, P.C.

(57) ABSTRACT

A semiconductor device includes: a semiconductor chip; and a field effect transistor formed on the semiconductor chip and including a plurality of unit cells, which include at least one first unit cell including a first on-resistance component and a first feedback capacitance component, and at least one second unit cell including a second on-resistance component forming a parallel component with respect to the first on-resistance component and exceeding the first on-resistance component and a second feedback capacitance component forming a parallel component with respect to the first feedback capacitance component and being less than the first feedback capacitance component.

19 Claims, 16 Drawing Sheets

SEMICONDUCTOR DEVICE

CROSS-REFERENCE TO RELATED APPLICATION

This application is based upon and claims the benefit of priority from Japanese Patent Application No. 2020-089941, filed on May 22, 2020, the entire contents of which are incorporated herein by reference.

TECHNICAL FIELD

The present disclosure relates to a semiconductor device including a field effect transistor including a plurality of unit cells.

BACKGROUND

A semiconductor device including a field effect transistor including a plurality of unit cells, for example, an in-trench double-gate-type vertical power MOSFEET (Metal Oxide Semiconductor Field Effect Transistor), is known in the related art. Specifically, this semiconductor device includes a semiconductor substrate, an n-type drift region, a p-type channel region (body region), a plurality of in-trench double-gate structures, and n-type source regions.

The drift region is formed on a surface layer of the semiconductor substrate. The channel region is formed on a surface layer of the drift region. Each of the plurality of in-trench double-gate structures includes a trench, a gate electrode, a field plate electrode, a gate oxide film, a field plate peripheral insulating film, and a field plate-gate insulating film. The trench is formed in the semiconductor substrate so as to penetrate the channel region. The gate electrode is buried on an opening side in the trench. The field plate electrode is buried on a bottom wall side in the trench.

The gate oxide film is interposed between the trench and the gate electrode. The field plate peripheral insulating film is interposed between the trench and the field plate electrode. The field plate-gate insulating film is interposed between the gate electrode and the field plate electrode. A gate potential is applied to both the gate electrode and the field plate electrode. Each of the plurality of source regions is formed in a region along the plurality of in-trench double-gate structure in a surface layer of the channel region.

SUMMARY

Some embodiments of the present disclosure provide a semiconductor device capable of shortening a switching descent time while suppressing an increase in power consumption in a structure including a field effect transistor including a plurality of unit cells.

According to one embodiment of the present disclosure, there is provided a semiconductor device, which includes: a semiconductor chip; and a field effect transistor formed on the semiconductor chip and including a plurality of unit cells, which include at least one first unit cell including a first on-resistance component and a first feedback capacitance component, and at least one second unit cell including a second on-resistance component forming a parallel component with respect to the first on-resistance component and exceeding the first on-resistance component and a second feedback capacitance component forming a parallel component with respect to the first feedback capacitance component and being less than the first feedback capacitance component.

According to another embodiment of the present disclosure, there is provided a semiconductor device, which includes: a semiconductor chip having a main surface; a first conductive type drift region formed on a surface layer of the main surface; a second conductive type body region formed on a surface layer of the first conductive type drift region; at least one first gate structure including a first upper electrode and a first lower electrode buried in a vertical direction with a first insulator interposed in a first trench formed on the main surface so as to penetrate the second conductive type body region; at least one second gate structure including a second upper electrode and a second lower electrode buried in the vertical direction with a second insulator interposed in a second trench formed on the main surface so as to penetrate the second conductive type body region; a first conductive type first source region that is formed in a region along the at least one first gate structure in a surface layer of the second conductive type body region such that a first channel is formed between the first conductive type drift region and the first conductive type first source region; and a first conductive type second source region that is formed in a region along the at least one second gate structure in the surface layer of the second conductive type body region such that a second channel is formed between the first conductive type drift region and the first conductive type second source region, wherein a gate potential is applied to both of the first upper electrode and the first lower electrode, and wherein the gate potential is applied to the second upper electrode and a source potential is applied to the second lower electrode.

DETAILED DESCRIPTION

Figure 1:
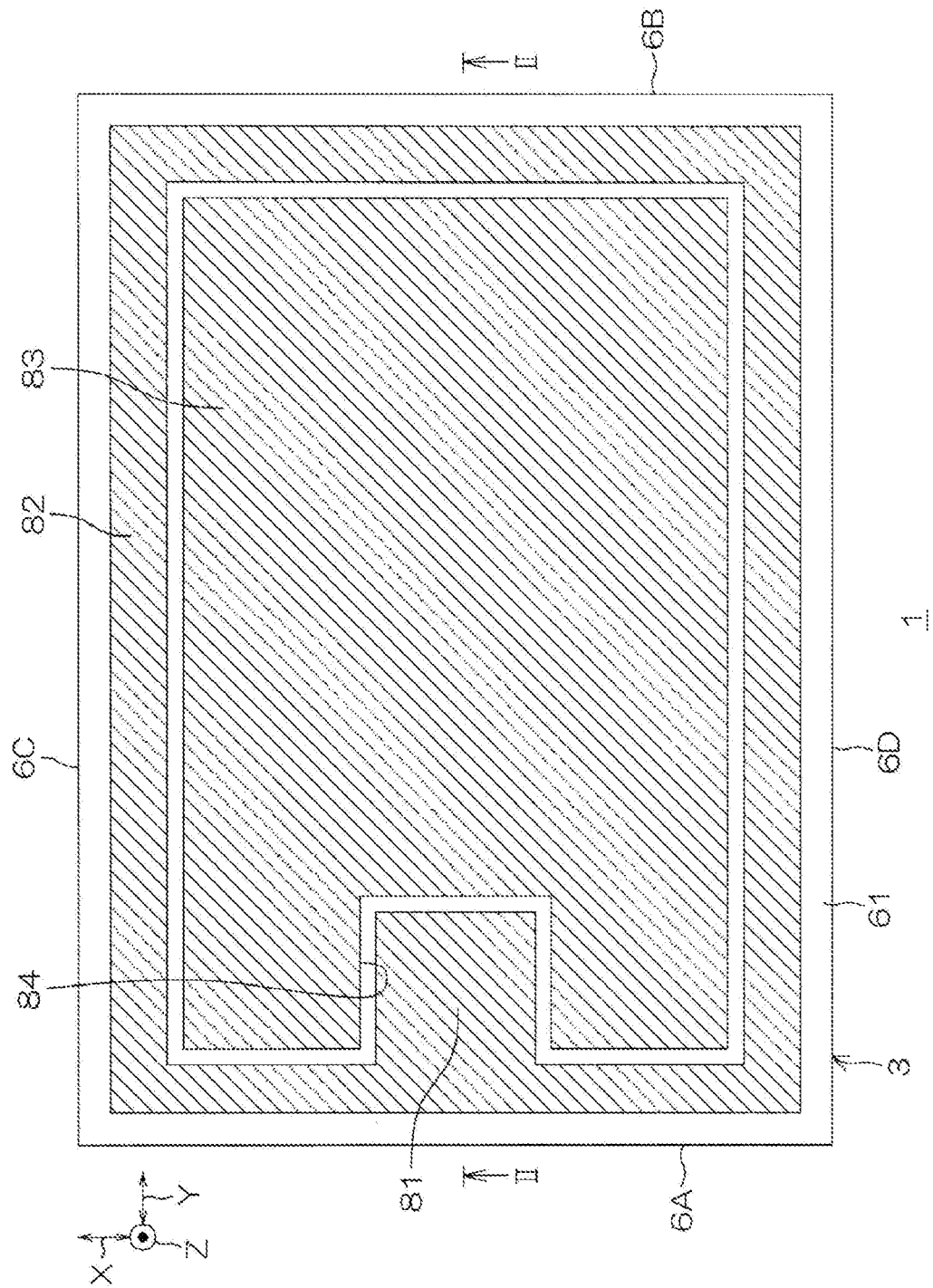
FIG. 1 is a plan view showing a semiconductor device according to an embodiment of the present disclosure.
Figure 2:
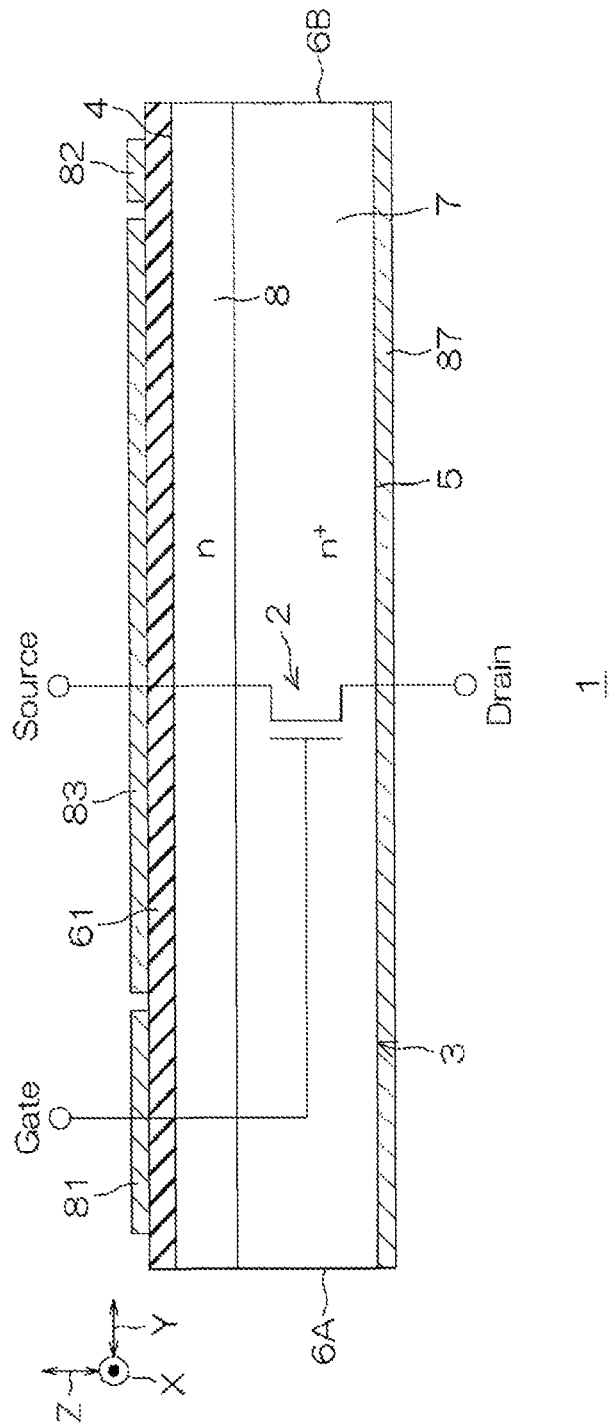
FIG. 2 is a cross-sectional view taken along line II-II in FIG. 1.
Figure 3:
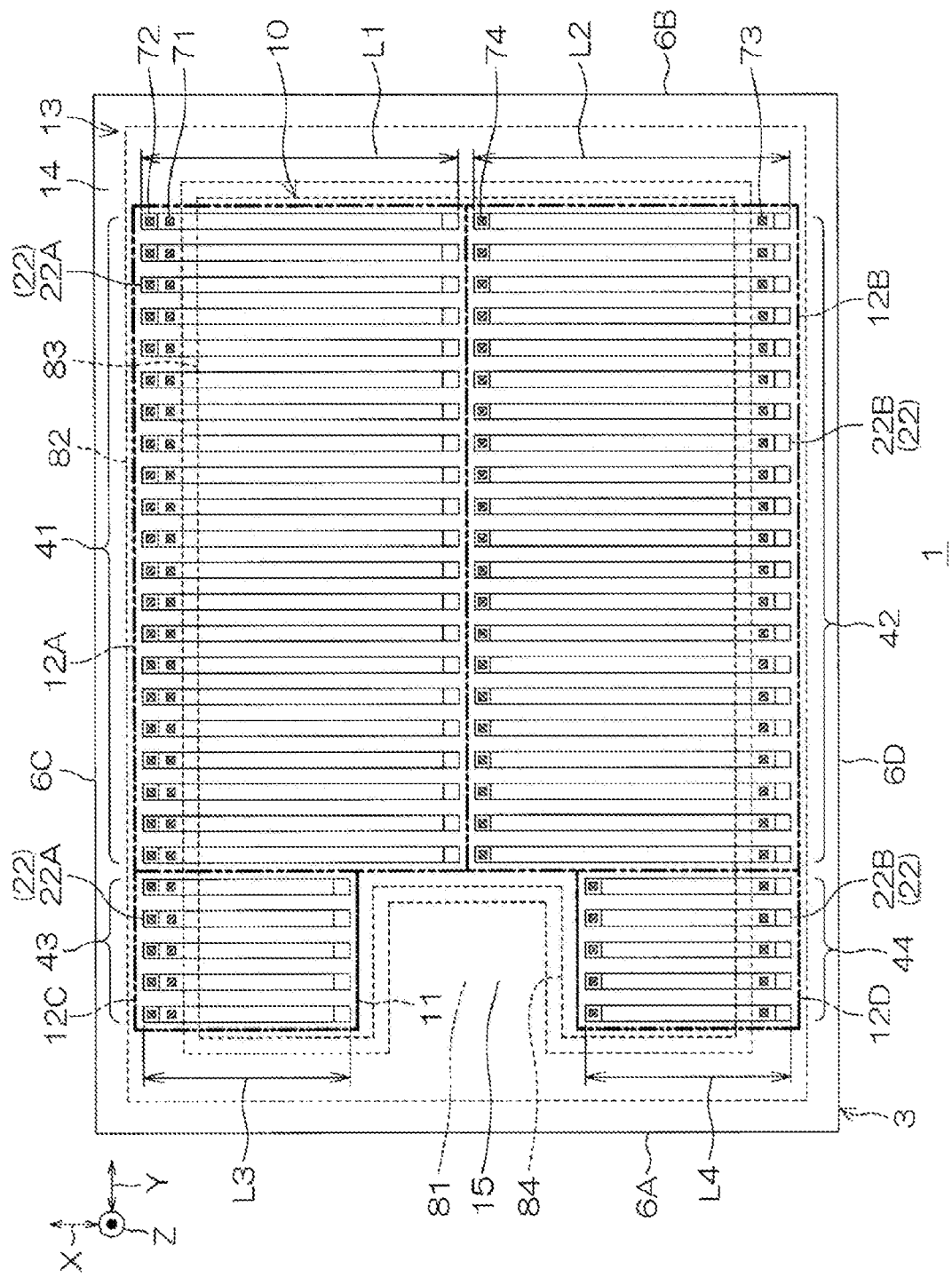
FIG. 3 is a plan view showing a structure of a main surface of the semiconductor chip shown in FIG. 1.
Figure 4:
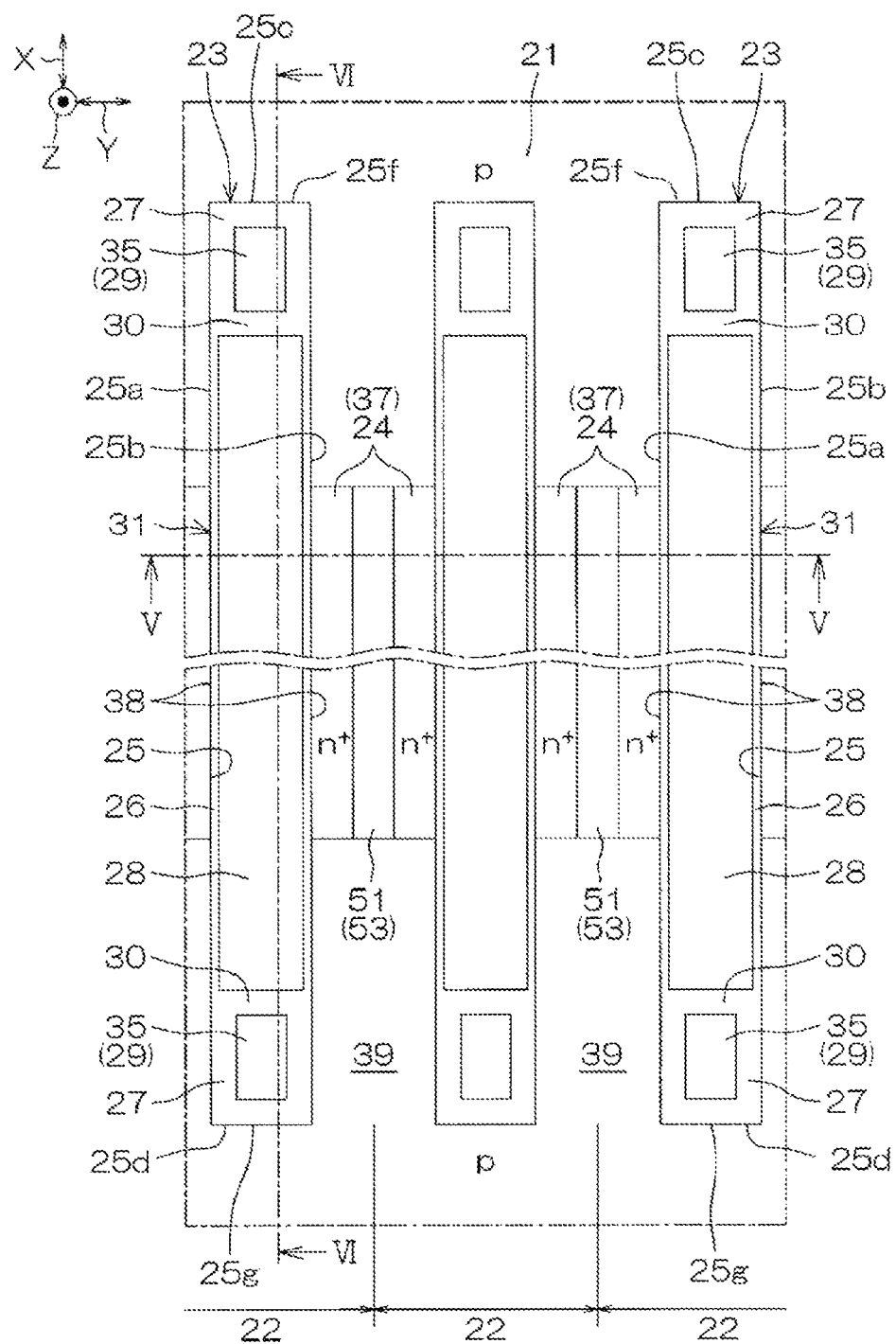
FIG. 4 is an enlarged plan view of a portion of a cell region extracted from the structure shown in FIG. 3.
Figure 5:
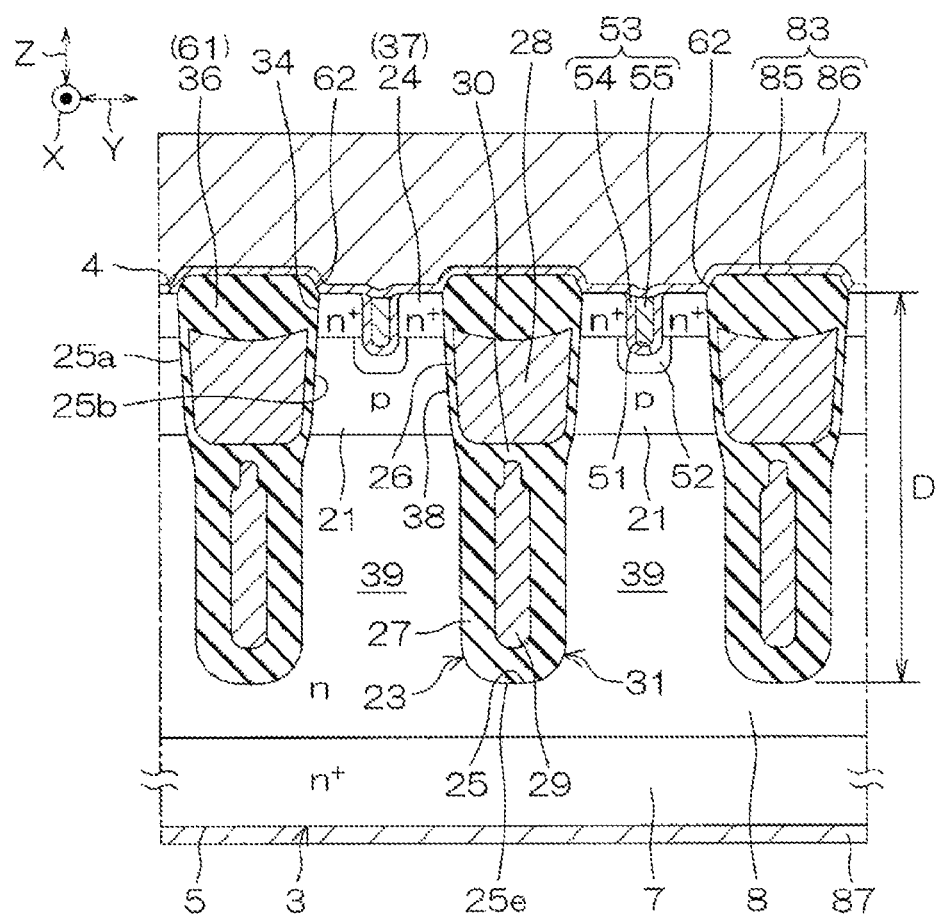
FIG. 5 is a cross-sectional view taken along line V-V in FIG. 4.
Figure 6:
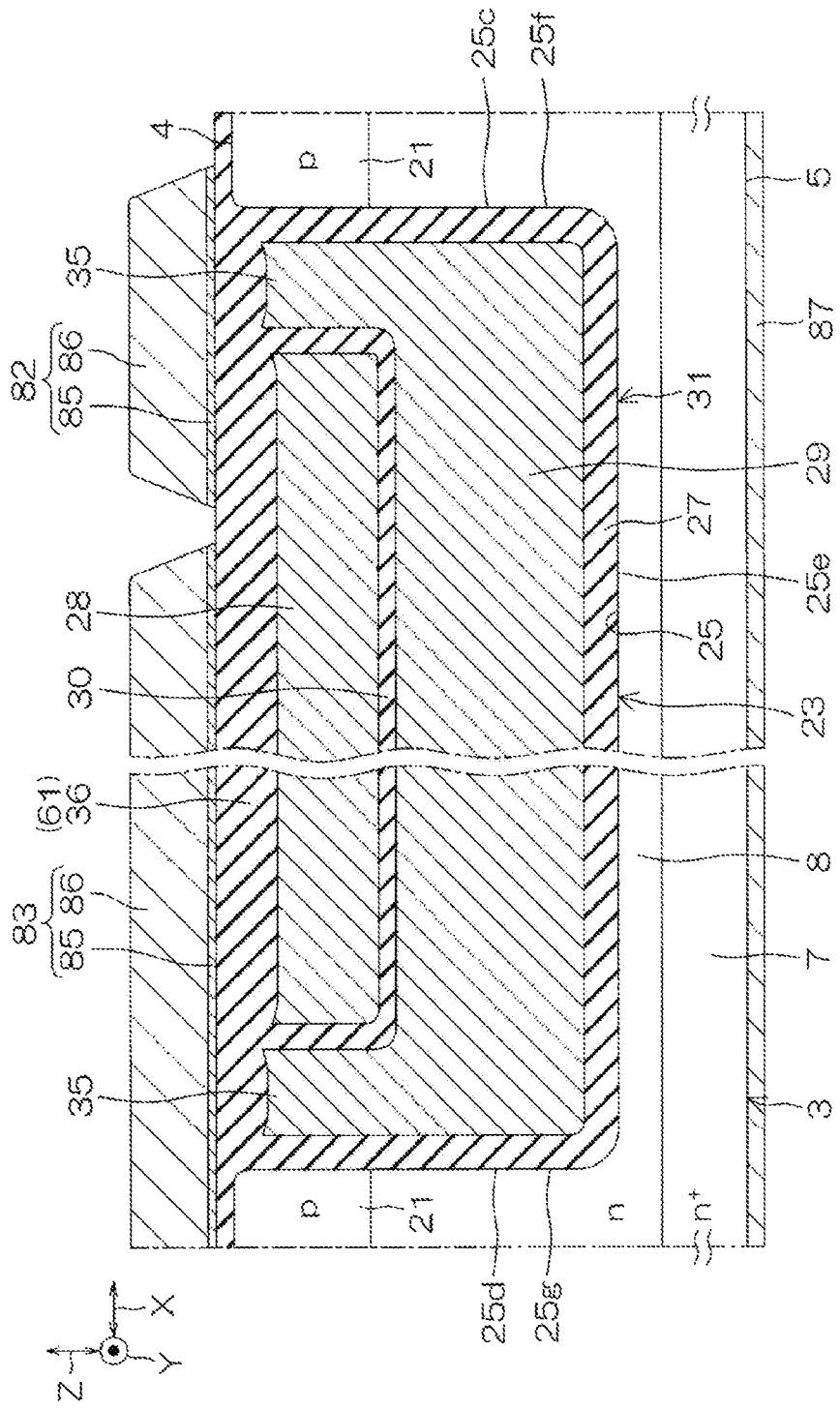
FIG. 6 is a cross-sectional view taken along line VI-VI in FIG. 4.
Figure 7:
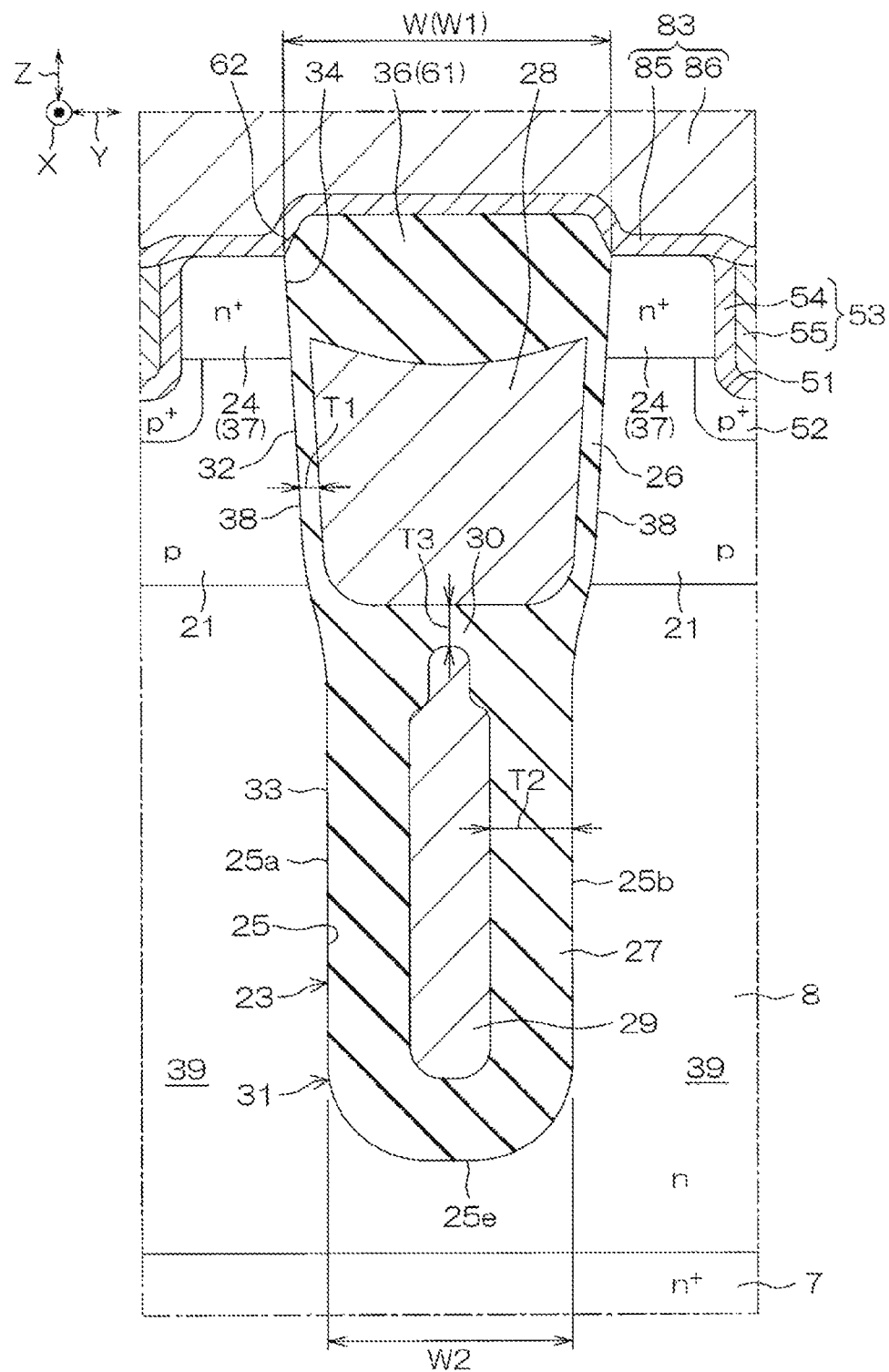
FIG. 7 is an enlarged cross-sectional view of the unit cell shown in FIG. 5.

Embodiments of the present disclosure will be now described in detail with reference to the accompanying drawings. FIG. 1 is a plan view showing a semiconductor device 1 according to a first embodiment of the present disclosure. FIG. 2 is a cross-sectional view taken along line II-II in FIG. 1. FIG. 3 is a plan view showing a structure of a first main surface 4 of a semiconductor chip 3 shown in FIG. 1. FIG. 4 is an enlarged plan view of a portion of a cell region 12 extracted from the structure shown in FIG. 3. FIG. 5 is a cross-sectional view taken along line V-V in FIG. 4. FIG. 6 is a cross-sectional view taken along line VI-VI in FIG. 4. FIG. 7 is an enlarged cross-sectional view of a unit cell 22 shown in FIG. 5.

Figure 8:
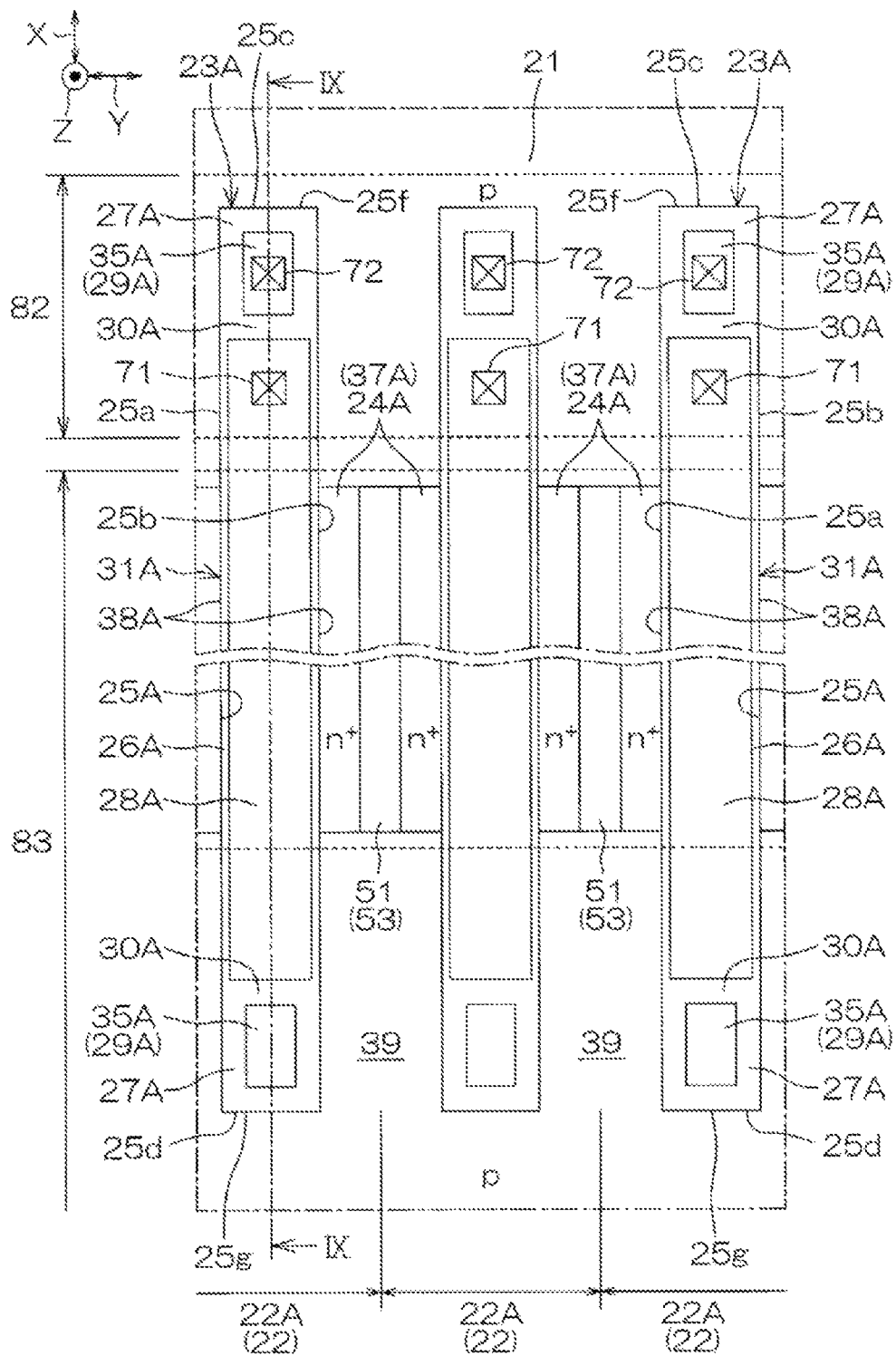
FIG. 8 is an enlarged plan view of a first unit cell is extracted from the structure shown in FIG. 3.
Figure 9:
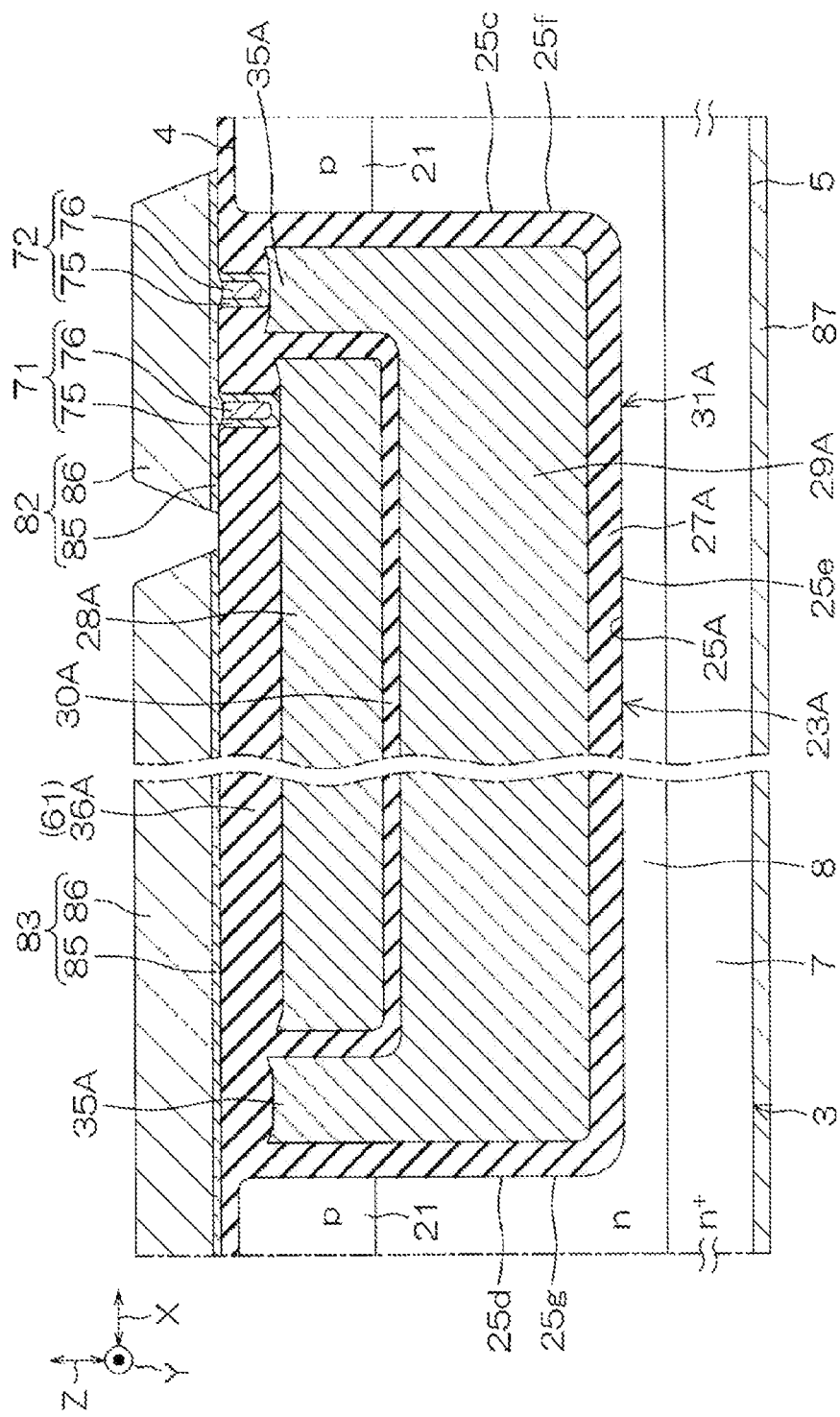
FIG. 9 is a cross-sectional view taken along line IX-IX in FIG. 8.
Figure 10:
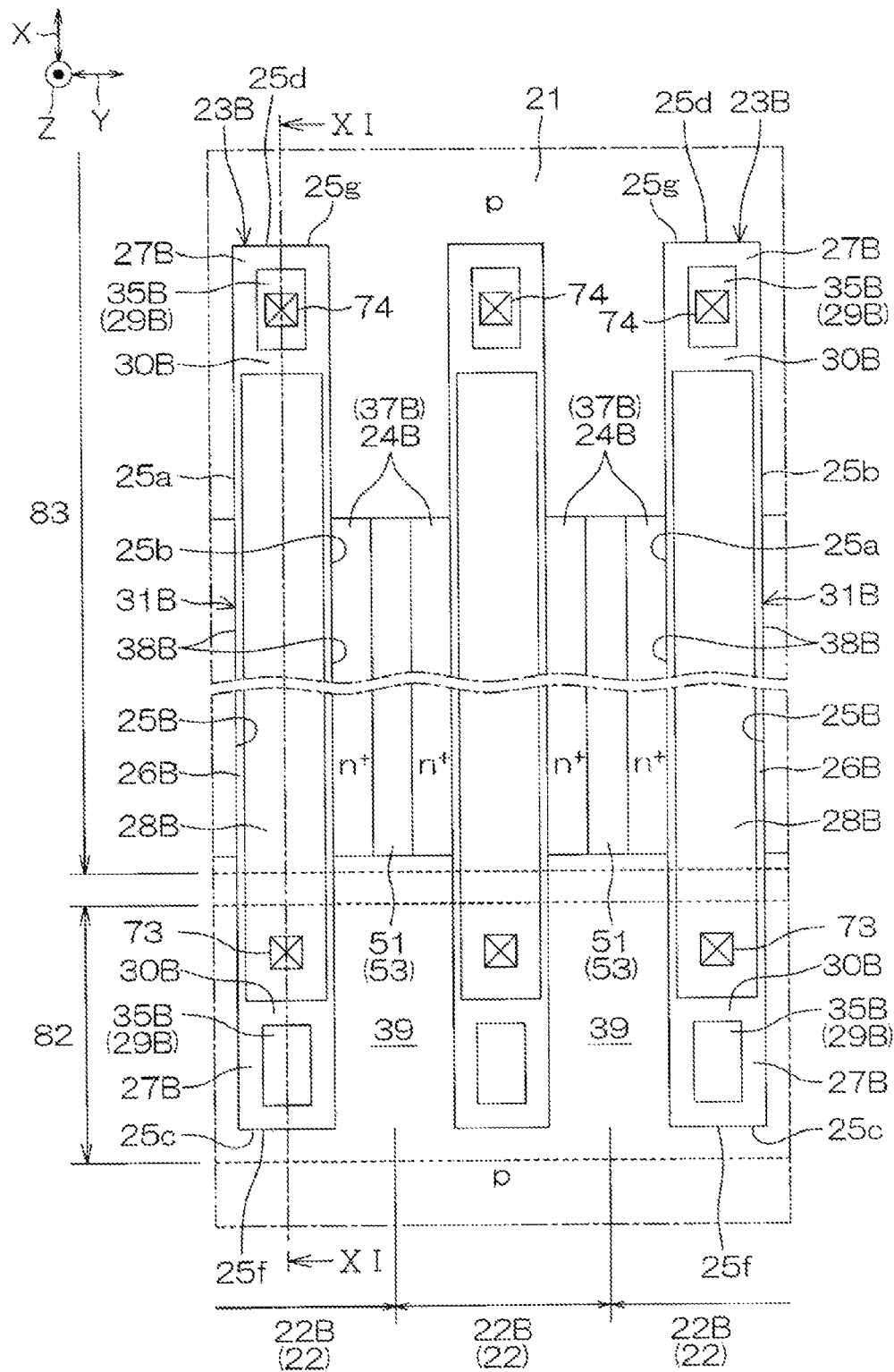
FIG. 10 is an enlarged plan view of a second unit cell extracted from the structure shown in FIG. 3.
Figure 11:
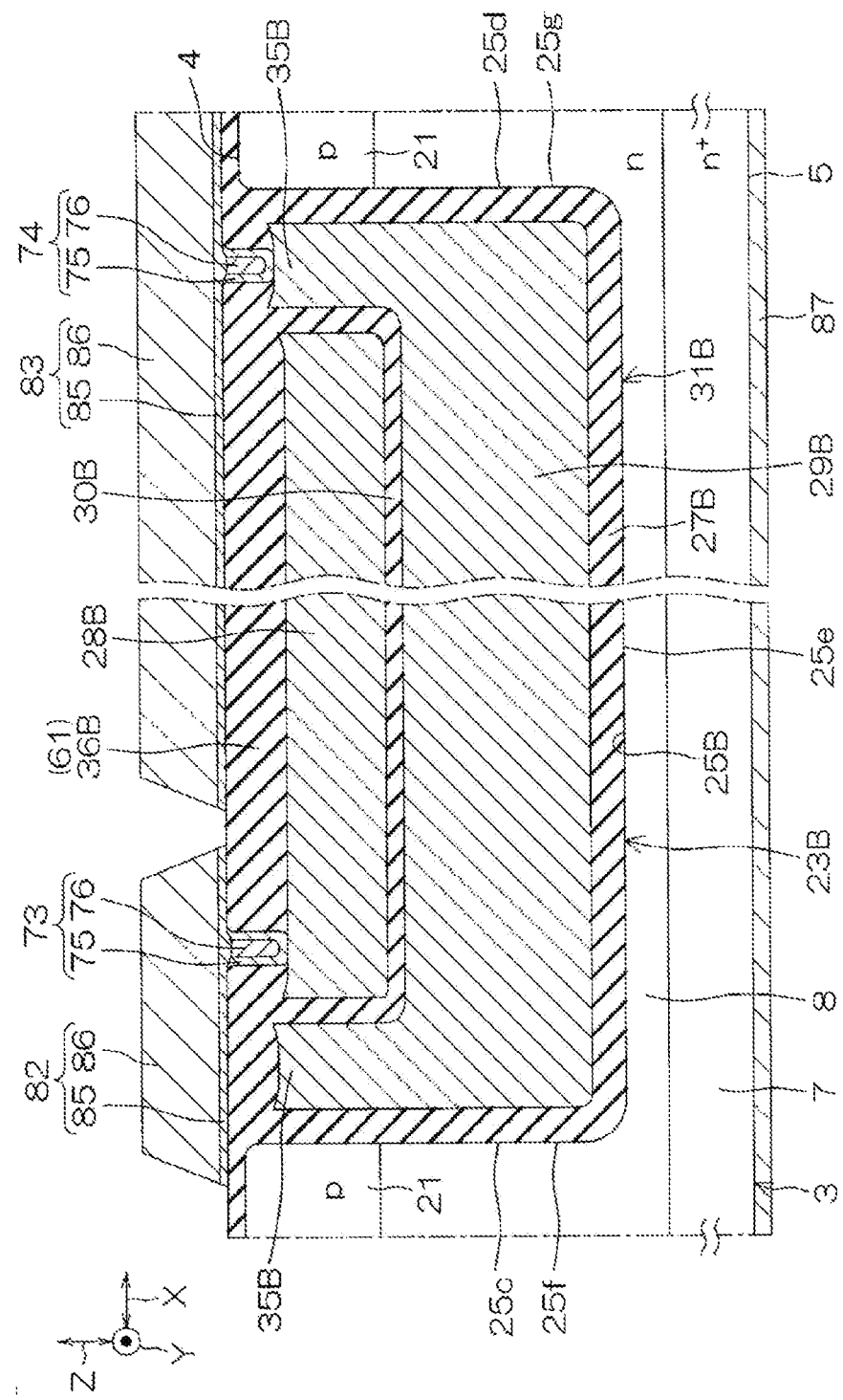
FIG. 11 is a cross-sectional view taken along line XI-XI in FIG. 10.
Figure 12:
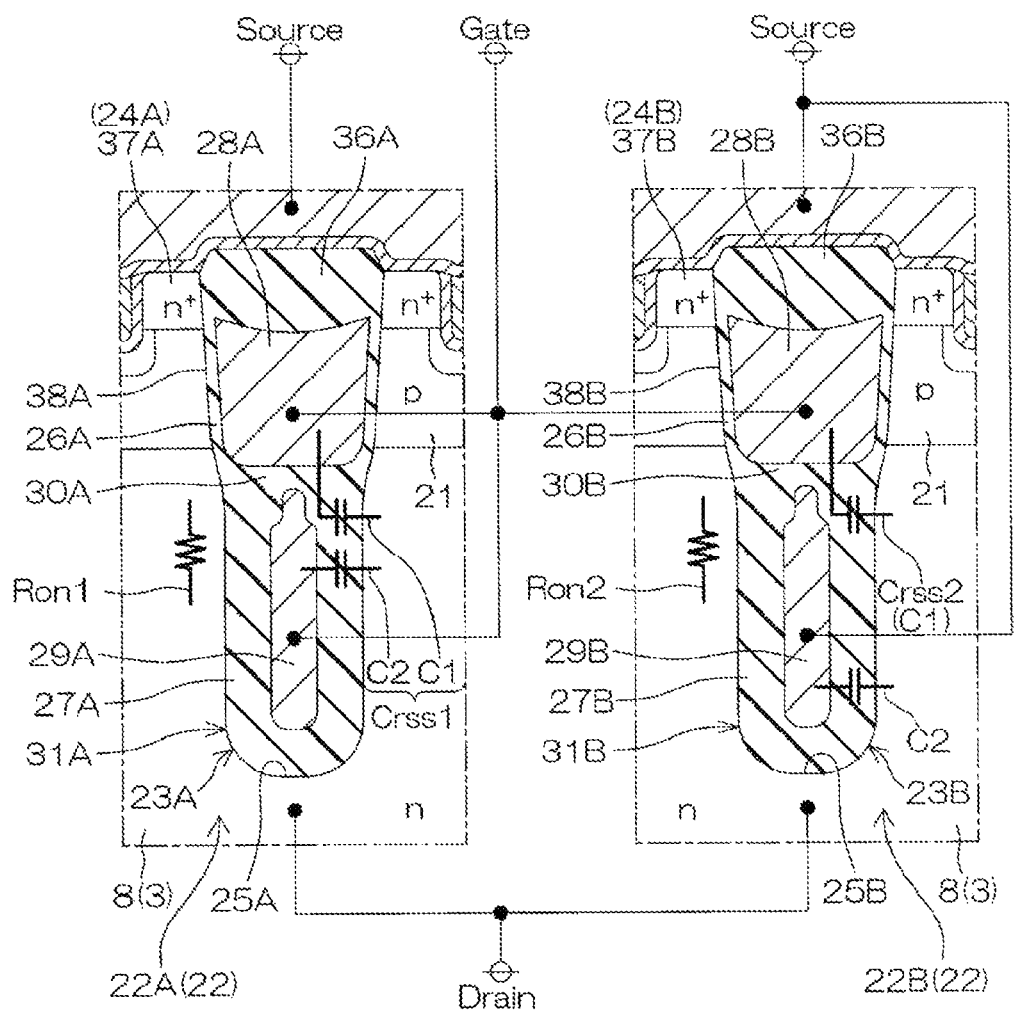
FIG. 12 is a diagram for explaining an electrical connection form of the first unit cell and the second unit cell.
Figure 13:
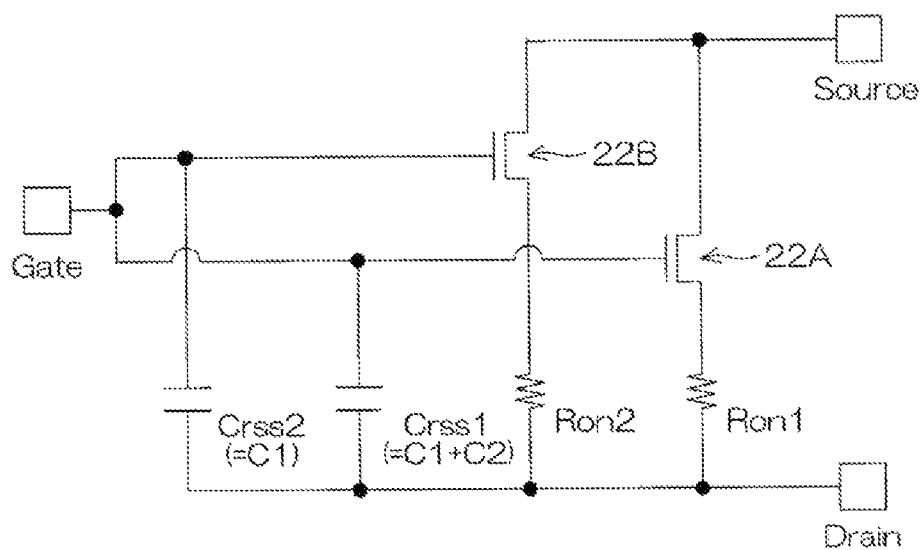
FIG. 13 is an electric circuit diagram for explaining an electrical connection form of the first unit cell and the second unit cell.

FIG. 8 is an enlarged plan view of a first unit cell 22A extracted from the structure shown in FIG. 3. FIG. 9 is a cross-sectional view taken along line IX-IX in FIG. 8. FIG. 10 is an enlarged plan view of a second unit cell 22B extracted from the structure shown in FIG. 3. FIG. 11 is a cross-sectional view taken along line XI-XI in FIG. 10. FIG. 12 is a diagram for explaining an electrical connection form of the first unit cell 22A and the second unit cell 22B. FIG. 13 is an electric circuit diagram for explaining the electrical connection form of the first unit cell 22A and the second unit cell 22B.

Referring to FIGS. 1 and 2, in this embodiment, the semiconductor device 1 is a switching device including a trench insulated gate-type MISFET (Metal Insulator Semiconductor Field Effect Transistor) 2 as an example of a field effect transistor. In FIG. 2, the MISFET 2 is simplified by a circuit symbol. The semiconductor device 1 includes a semiconductor chip 3 formed in a rectangular parallelepiped shape. In this embodiment, the semiconductor chip 3 includes a silicon (Si) chip. The semiconductor chip 3 includes a first main surface 4 on one side, a second main surface 5 on the other side, and first to fourth side surfaces 6A to 6D connecting the first main surface 4 and the second main surface 5. The first main surface 4 and the second main surface 5 are formed in a quadrangular shape (specifically, a rectangular shape) when viewed in a plan view from their normal direction Z (hereinafter simply referred to as a "plan view").

The first to fourth side surfaces 6A to 6D include a first side surface 6A, a second side surface 6B, a third side surface 6C, and a fourth side surface 6D. The first side surface 6A and the second side surface 6B extend in a first direction X along the first main surface 4 and face each other in a second direction Y intersecting the first direction X. Specifically, the second direction Y is orthogonal to the first direction X. The first side surface 6A and the second side surface 6B form a short side of the semiconductor chip 3. The third side surface 6C and the fourth side surface 6D extend in the second direction Y and face each other in the first direction X. The third side surface 6C and the fourth side surface 6D form a long side of the semiconductor chip 3.

The semiconductor device 1 includes an n-type (first conductive type) drain region 7 (first impurity region) formed on the surface layer of the second main surface 5 of the semiconductor chip 3. The drain region 7 forms the drain of the MISFET 2. The drain region 7 is formed over the entire region of the surface layer of the second main surface 5 and is exposed from the second main surface 5 and the first to fourth side surfaces 6A to 6D. The n-type impurity concentration of the drain region 7 may be $1\times10^{18}$ cm$^{-3}$ or more and $1\times10^{21}$ cm$^{-3}$ or less. In this embodiment, the drain region 7 is formed of an n-type semiconductor substrate (Si substrate).

A thickness of the drain region 7 may be 10 μm or more and 450 μm or less. The thickness of the drain region 7 may be 10 μm or more and 50 μm or less, 50 μm or more and 150 μm or less, 150 μm or more and 250 μm or less, 250 μm or more and 350 μm or less, and 350 μm or more and 450 μm or less. The thickness of the drain region 7 may be 50 μm or more and 150 μm or less in some embodiments.

The semiconductor device 1 includes an n-type drift region 8 (second impurity region) formed on the surface layer of the first main surface 4 of the semiconductor chip 3. The drift region 8 forms a drain of the MISFET 2 together with the drain region 7. The drift region 8 is formed over the entire region of the surface layer of the first main surface 4 so as to be electrically connected to the drain region 7, and is exposed from the first main surface 4 and the first to fourth side surfaces 6A to 6D.

The drift region 8 has an n-type impurity concentration less than an n-type impurity concentration of the drain region 7. The n-type impurity concentration of the drift region 8 may be $1\times10^{15}$ cm$^3$ or more and $1\times10^{18}$ cm$^3$ or less. In this embodiment, the drift region 8 is formed by an n-type epitaxial layer (Si epitaxial layer). The drift region 8 has a thickness less than the thickness of the drain region 7. The thickness of the drift region 8 may be 5 μm or more and 20 μm or less. The thickness of the drift region 8 may be 5 μm or more and 10 μm or less, 10 μm or more and 15 μm or less, or 15 μm or more and 20 μm or less. The thickness of the drift region 8 may be 5 μm or more and 15 μm or less in some embodiments.

Referring to FIGS. 3 to 7, the semiconductor device 1 includes an active region 10 set on the first main surface 4. The active region 10 is a region where the MISFET 2 is formed. In this embodiment, only one active region 10 is set on the first main surface 4. That is, in this embodiment, the semiconductor device 1 is formed of a discrete device including a single active region 10. The active region 10 is set in a central portion of the first main surface 4 at an interval inward from the first to fourth side surfaces 6A to 6D. The active region 10 is set in a polygonal shape having four sides parallel to the first to fourth side surfaces 6A to 6D. In this embodiment, the active region 10 has a recess 11 recessed toward the inside of the first main surface 4 at the central portion of the side along the first side surface 6A in the plan view.

The active region 10 includes at least one cell region 12. The cell region 12 is a region in which a transistor cell forming the smallest unit of the MISFET 2 is formed. The number, planar area, arrangement, and the like of cell regions 12 are optional and are not particularly limited. In this embodiment, the active region 10 includes four cell regions 12 set in four different regions. The four cell regions 12 include a first cell region 12A, a second cell region 12B, a third cell region 12C, and a fourth cell region 12D. The first cell region 12A is set in a region on the side of the second side surface 6B with respect to the recess 11 in a region on the side of the third side surface 6C of the active region 10. The first cell region 12A faces the recess 11 in the second direction Y. The second cell region 12B is set in the region on the side of the second side surface 6B with respect to the recess 11 in a region on the side of the fourth side surface 6D of the active region 10. The second cell region 12B faces the recess 11 in the second direction Y.

The third cell region 12C is set in the region on the side of the third side surface 6C with respect to the recess 11 and faces the recess 11 in the first direction X. The third cell region 12C has a width less than a width of the first cell region 12A with respect to the first direction X. The fourth cell region 12D is set in the region on the side of the fourth side surface 6D with respect to the recess 11 and faces the recess 11 in the first direction X. The fourth cell region 12D faces the third cell region 12C with the recess 11 interposed therebetween. The fourth cell region 12D has a width less than a width of the second cell region 12B with respect to the first direction X.

The semiconductor device 1 includes an inactive region 13 set on the first main surface 4. The inactive region 13 is a region where a transistor cell (MISFET 2) is not formed, and is set outside the active region 10. The inactive region 13 includes an annular region 14 and a pad region 15. The annular region 14 extends in a stripe shape along the first to fourth side surfaces 6A to 6D in a plan view and is set in an annular shape (specifically, a square annular shape) surrounding the active region 10. The pad region 15 projects in a convex manner from a portion along the first side surface 6A in the annular region 14 toward the active region 10 so as to be aligned with the recess 11 of the active region 10. The pad region 15 is a region that supports a gate pad electrode 81, which will be described later.

The semiconductor device 1 includes a p-type body region 21 formed on the surface layer of the drift region 8 in the active region 10. The p-type impurity concentration of the body region 21 may be $1\times10^{16}$ cm$^{-3}$ or more and $1\times10^{18}$ cm$^{-3}$ or less. The body region 21 is formed over the entire region of the surface layer of the drift region 8 in the active region 10. The body region 21 is formed on the side of the first main surface 4 at an interval from a bottom of the drift region 8.

The semiconductor device 1 includes a plurality of unit cells 22 formed in the active region 10. Each unit cell 22 forms the smallest unit of the MISFET 2 as a transistor cell. The plurality of unit cells 22 are formed in the first to fourth cell regions 12A to 12D, respectively. The number of unit cells 22 included in the first to fourth cell regions 12A to 12D is optional, and the unit cells 22 may not be formed in all the cell regions 12. However, from the viewpoint of obtaining good device characteristics, the plurality of unit cells 22 may be formed in all the cell regions 12.

The plurality of unit cells 22 (twenty-one unit cells 22 in this embodiment) of the first cell region 12A are each formed in a stripe shape extending in the first direction X and are formed at intervals in the second direction Y. That is, the plurality of unit cells 22 of the first cell region 12A are formed in a stripe shape extending in the first direction X as a whole. The plurality of unit cells 22 of the first cell region 12A extend in a stripe shape from the third side surface 6C side toward the central portion of the active region 10 and face the recess 11 in the second direction Y. The plurality of unit cells 22 of the first cell region 12A have a first length L1 with respect to the first direction X.

The plurality of unit cells 22 (twenty-one unit cells 22 in this embodiment) of the second cell region 12B are each formed in a stripe shape extending in the first direction X and are formed at intervals in the second direction Y. That is, the plurality of unit cells 22 of the second cell region 12B are formed in a stripe shape extending in the first direction X as a whole. The plurality of unit cells 22 of the second cell region 12B extend in a stripe shape from the fourth side surface 6D side toward the central portion of the active region 10 and face the recess 11 in the second direction Y.

The plurality of unit cells 22 of the second cell region 12B are formed at intervals from the plurality of unit cells 22 of the first cell region 12A in the first direction X. The plurality of unit cells 22 of the second cell region 12B face the plurality of unit cells 22 of the first cell region 12A in the first direction X. Specifically, the plurality of unit cells 22 of the second cell region 12B face the plurality of unit cells 22 of the first cell region 12A in the first direction X in a one-to-one correspondence relationship. The plurality of unit cells 22 of the second cell region 12B have a second length L2 with respect to the first direction X. The second length L2 may be equal to the first length L1.

The plurality of unit cells 22 (five unit cells 22 in this embodiment) of the third cell region 12C are each formed in a stripe shape extending in the first direction X and are formed at intervals in the second direction Y. That is, the plurality of unit cells 22 of the third cell region 12C are formed in a stripe shape extending in the first direction X as a whole. The plurality of unit cells 22 of the third cell region 12C extend in a stripe shape from the third side surface 6C toward the recess 11 and face the recess 11 in the first direction X. The plurality of unit cells 22 of the third cell region 12C face the plurality of unit cells 22 of the first cell region 12A in the second direction Y. The plurality of unit cells 22 of the third cell region 12C have a third length L3 that is less than the first length L1 with respect to the first direction X.

The plurality of unit cells 22 (five unit cells 22 in this embodiment) of the fourth cell region 12D are each formed in a stripe shape extending in the first direction X and are formed at intervals in the second direction Y. That is, the plurality of unit cells 22 of the fourth cell region 12D are formed in a stripe shape extending in the first direction X as a whole. The plurality of unit cells 22 of the fourth cell region 12D extend in a stripe shape from the fourth side surface 6D toward the recess 11 and face the recess 11 in the first direction X.

The plurality of unit cells 22 of the fourth cell region 12D face the plurality of unit cells 22 of the third cell region 12C with the recess 11 interposed therebetween. Specifically, the plurality of unit cells 22 of the fourth cell region 12D face the plurality of unit cells 22 of the third cell region 12C in the first direction X in a one-to-one correspondence. Further, the plurality of unit cells 22 of the fourth cell region 12D face the plurality of unit cells 22 of the second cell region 12B in the second direction Y. The plurality of unit cells 22 of the fourth cell region 12D have a fourth length L4 that is less than the second length L2 with respect to the first direction X.

Referring to FIGS. 4 to 7, each of the plurality of unit cells 22 includes a gate structure 23 and a channel cell 24. Specifically, the gate structure 23 has a multi-electrode structure including a trench 25, an upper insulating film 26, a lower insulating film 27, an upper electrode 28, a lower electrode 29, and an intermediate insulating film 30. The upper insulating film 26, the lower insulating film 27, and the intermediate insulating film 30 are integrated to form one insulator 31. As a result, the upper electrode 28 and the lower electrode 29 are buried in the trench 25 so as to be vertically insulated and separated by the insulator 31.

The trench 25 is dug down from the first main surface 4 to the second main surface 5. The trench 25 is formed to penetrate the body region 21 so as to reach the drift region 8. The trench 25 is formed in a stripe shape extending in the first direction X. The first to fourth lengths L1 to L4 of the plurality of unit cells 22 are defined by the lengths of the trench 25 (the gate structure 23) in the first direction X.

The trench 25 has a first side wall 25a, a second side wall 25b, a third side wall 25c, a fourth side wall 25d, and a bottom wall 25e. The first side wall 25a and the second side wall 25b are long side walls extending in the first direction X. The third side wall 25c and the fourth side wall 25d are short side walls extending in the second direction Y. The third side wall 25c is the short side wall located on the outer side of the first main surface 4. The fourth side wall 25d is the short side wall located on the inner side of the first main surface 4.

The bottom wall 25e is formed in a stripe shape extending in the first direction X and connects the first side wall 25a, the second side wall 25b, the third side wall 25c, and the fourth side wall 25d. The trench 25 has one end portion 25f and the other end portion 25g with respect to the first direction X. The one end portion 25f of the trench 25 is an end portion of the outer side of the first main surface 4. The other end portion 25g of the trench 25 is an end portion of the inner side of the first main surface 4.

In this embodiment, the trench 25 is formed in a tapered shape in which an opening width narrows from an opening toward the bottom wall 25e. Specifically, the trench 25 includes a first trench portion 32 on the side of the opening and a second trench portion 33 on the side of the bottom wall 25e. The first trench portion 32 is formed in an exposed portion of the body region 21 in the trench 25 and has a first trench width W1 in the second direction Y.

The second trench portion 33 is formed in an exposed portion of the drift region 8 in the trench 25 and has a second trench width W2 that is less than the first trench width W1 in the second direction Y. The second trench portion 33 is formed in a region between the first trench portion 32 and the bottom wall 25e in the trench 25. An upper end portion of the second trench portion 33 may be formed in the exposed portion of the body region 21, or may be formed in the drift region 8 at an interval from a bottom portion of the body region 21.

The trench 25 has a trench width W and a trench depth D. The trench width W is defined by the first trench width W1. The trench width W may be 0.5 µm or more and 3 µm or less. The trench width W may be 0.5 µm or more and 1 µm or less, 1 µm or more and 2 µm or less, or 2 µm or more and 3 µm or less. The trench width W may be 0.5 µm or more and 2 µm or less. The trench depth D may be 1 µm or more and 10 µm or less. The trench depth D may be 1 µm or more and 2.5 µm or less, 2.5 µm or more and 5 µm or less, 5 µm or more and 7.5 µm or less, or 7.5 µm or more and 10 µm or less. The trench depth D may be 2 µm or more and 6 µm or less.

An aspect ratio D/W of the trench 25 may exceed 1 and may be 5 or less. The aspect ratio D/W is a ratio of the trench depth D to the trench width W. Specifically, the aspect ratio D/W may be 2 or more. The bottom wall 25e of the trench 25 may be formed at an interval of 1 µm or more and 10 µm or less with respect to a bottom portion of the drift region 8. Specifically, the bottom wall 25e of the trench 25 may be formed at an interval of 1 µm or more and 5 µm or less with respect to the bottom portion of the drift region 8. As a result, the trench 25 faces the drain region 7 with a portion of the drift region 8 interposed therebetween.

The upper insulating film 26 covers an upper wall surface of the trench 25. Specifically, the upper insulating film 26 covers the upper wall surface located in a region on the side of the opening of the trench 25 with respect to the bottom portion of the body region 21. That is, the upper insulating film 26 covers the first trench portion 32. A lower portion of the upper insulating film 26 crosses a boundary between the drift region 8 and the body region 21. The upper insulating film 26 has a portion that covers the body region 21, and a portion that covers the drift region 8. A covering area of the upper insulating film 26 with respect to the body region 21 is larger than a covering area of the upper insulating film 26 with respect to the drift region 8. In this embodiment, the upper insulating film 26 contains silicon oxide. The upper insulating film 26 is formed as a gate insulating film.

The upper insulating film 26 has a first thickness T1. The first thickness T1 is a thickness of the upper insulating film 26 along a normal direction of the wall surface of the trench 25. The first thickness T1 may be 0.01 µm or more and 0.05 µm or less. The first thickness T1 may be 0.01 µm or more and 0.02 µm or less, 0.02 µm or more and 0.03 µm or less, 0.03 µm or more and 0.04 µm or less, or 0.04 µm or more and 0.05 µm or less. The first thickness T1 may be 0.02 µm or more and 0.04 µm or less.

The lower insulating film 27 covers a lower wall surface of the trench 25. Specifically, the lower insulating film 27 covers the lower wall surface located in a region on the side of the bottom wall 25e of the trench 25 with respect to the bottom portion of the body region 21. That is, the lower insulating film 27 covers the second trench portion 33. The lower insulating film 27 partitions a U-shaped recess space in the region on the side of the bottom wall 25e of the trench 25. The lower insulating film 27 is in contact with the drift region 8. In this embodiment, the lower insulating film 27 contains silicon oxide. The lower insulating film 27 is formed as a field insulating film.

The lower insulating film 27 has a second thickness T2 (T1<T2) that exceeds the first thickness T1 of the upper insulating film 26. The second thickness T2 is a thickness of the lower insulating film 27 along the normal direction of the wall surface of the trench 25. The second thickness T2 may be 0.1 µm or more and 1 µm or less. The second thickness T2 may be 0.1 µm or more and 0.25 µm or less, 0.25 µm or more and 0.5 µm or less, 0.5 µm or more and 0.75 µm or less, or 0.75 µm or more and 1 µm or less. The second thickness T2 may be 0.15 µm or more and 0.65 µm or less.

The upper electrode 28 is buried on the side of the opening side of the trench 25 with the upper insulating film 26 interposed therebetween. The upper electrode 28 is formed in a stripe shape (rectangular shape) extending in the first direction X in a plan view. The upper electrode 28 faces the body region 21 and the drift region 8 with the upper insulating film 26 interposed therebetween. The upper electrode 28 faces the drift region 8 with a first facing area. The upper electrode 28 has an upper end portion located on the side of the bottom wall 25e of the trench 25 with respect to the first main surface 4. The upper end portion of the upper electrode 28 may be formed in a curved shape toward the bottom wall 25e of the trench 25. The upper end portion of the upper electrode 28 partitions a recess 34, which is recessed toward the bottom wall 25e, among the first to fourth side walls 25a to 25d of the trench 25. The upper electrode 28 has a flat lower end portion. In this embodiment, the upper electrode 28 contains conductive polysilicon. The upper electrode 28 is formed as a gate electrode.

The lower electrode 29 is buried on the side of the bottom wall 25e in the trench 25 with the lower insulating film 27 interposed therebetween. The lower electrode 29 is formed in a stripe shape (rectangular shape) extending in the first direction X in a plan view. The lower electrode 29 faces the drift region 8 with the lower insulating film 27 interposed therebetween. The lower electrode 29 is formed at an interval from the upper electrode 28 on the side of the bottom wall 25e of the trench 25 and faces the upper electrode 28 in the normal direction Z. The lower electrode 29 faces the drift region 8 with the second facing area that exceeds the first facing area. In this embodiment, the lower electrode 29 contains conductive polysilicon. The lower electrode 29 is formed as a gate electrode or a source electrode (that is, a field electrode).

The intermediate insulating film 30 is interposed between the upper electrode 28 and the lower electrode 29 to electrically isolate the upper electrode 28 and the lower electrode 29 from each other. The intermediate insulating film 30 is connected to the upper insulating film 26 and the lower insulating film 27. In this embodiment, the intermediate insulating film 30 contains silicon oxide. The intermediate insulating film 30 has a third thickness T3 (T1<T3) that exceeds the first thickness T1 of the upper insulating film 26 in the normal direction Z. The third thickness T3 may be equal to the second thickness T2 of the lower insulating film 27. The third thickness T3 may exceed the second thickness T2 or may be less than the second thickness T2.

The third thickness T3 may be 0.1 µm or more and 1 µm or less. The third thickness T3 may be 0.1 µm or more and 0.25 µm or less, 0.25 µm or more and 0.5 µm or less, 0.5 µm or more and 0.75 µm or less, or 0.75 µm or more and 1 µm or less. The third thickness T3 may be 0.15 µm or more and 0.65 µm or less. The gate structure 23 includes one or more (two in this embodiment) lead-out electrodes 35 formed of a portion of the lower electrode 29 and drawn out to the side of the opening of the trench 25 while being interposed in the insulator 31 (specifically, being interposed between the lower insulating film 27 and the intermediate insulating film 30). In this embodiment, a plurality of the lead-out electrodes 35 are formed on the side of the one end portion 25f and the side of the other end portion 25g of the trench 25.

Considering a plurality of gate structures 23, the plurality of lead-out electrodes 35 are arranged in a row in the first direction X and the second direction Y in a plan view. An arrangement and the number of lead-out electrodes 35 are optional and are appropriately adjusted according to a length of the trench 25 and a wiring layout. For example, the plurality of lead-out electrodes 35 may be formed along a direction in which the trench 25 extends. Further, three lead-out electrodes 35 may be formed at the one end portion 25f, the other end portion 25g and the central portion of the trench 25.

In this embodiment, the gate structure 23 further includes a buried insulator 36 buried in the recess 34 of the trench 25. The buried insulator 36 covers the upper end portion of the upper electrode 28 in the trench 25. In this embodiment, the buried insulator 36 contains silicon oxide. The channel cell 24 is a region adjacent to the gate structure 23 and in which the opening and closing of a current path is controlled by the gate structure 23. In this embodiment, the unit cell 22 includes a pair of channel cells 24 formed on both sides of the gate structure 23. Specifically, the pair of channel cells 24 includes a first side channel cell 24 formed on the side of the first side wall 25a of the trench 25 and a second side channel cell 24 formed on the side of the second side wall 25b of the trench 25. The unit cell 22 does not have a channel cell 24 on the side of the third side wall 25c and on the side of the fourth side wall 25d of the trench 25.

Each channel cell 24 includes an n-type source region 37 formed on the surface layer of the body region 21. The source of the MISFET 2 is formed by the source region 37 formed in all the channel cells 24. Each channel cell 24 may be considered to be formed by the source region 37. The source region 37 has an n-type impurity concentration that exceeds the n-type impurity concentration of the drift region 8. The n-type impurity concentration of the source region 37 may be $1\times10^{18}$ cm$^{-3}$ or more and $1\times10^{21}$ cm$^{-3}$ or less. In each channel cell 24, the source region 37 is formed on the side of the first main surface 4 at an interval from the bottom portion of the body region 21 and defines a channel 38 of the unit cell 22 between the drift region 8 and the source region 37.

In the first side channel cell 24, the source region 37 is formed in a stripe shape extending along the first side wall 25a of the gate structure 23 in a plan view. In the first side channel cell 24, the source region 37 covers the buried insulator 36 and faces the upper electrode 28 with the upper insulating film 26 interposed therebetween. Similarly, in the second side channel cell 24, the source region 37 is formed in a stripe shape extending along the second side wall 25b of the gate structure 23 in a plan view. In the second side channel cell 24, the source region 37 covers the buried insulator 36 and faces the upper electrode 28 with the upper insulating film 26 interposed therebetween.

The plurality of unit cells 22 are formed so that the plurality of gate structures 23 are arranged side by side in a row at intervals in the second direction Y. That is, the plurality of gate structures 23 are formed in a stripe shape extending in the first direction X in the first to fourth cell regions 12A to 12D in a plan view and are formed at intervals in the second direction Y. Plateau-shaped mesa portions 39 extending in the first direction X are respectively partitioned in a region between the pair of gate structures 23 adjacent to each other in the active region 10.

That is, the plurality of gate structures 23 are formed alternately with the plurality of mesa portions 39 in the second direction Y in a manner that one mesa portion 39 is interposed therebetween. Each of the plurality of unit cells 22 is formed so that the pair of channel cells 24 is located at the mesa portions 39 on both sides. In this embodiment, the plurality of unit cells 22 are each formed by a region between the central portions of a pair of adjacent mesa portions 39.

Referring to FIGS. 3 and 8 to 13, the plurality of unit cells 22 include at least one first unit cell 22A to which a first electric signal is applied, and at least one second unit cell 22B to which a second electric signal different from the first electric signal is applied. That is, the semiconductor device 1 includes at least one first unit cell 22A and at least one second unit cell 22B, which are formed collectively in a single active region 10. The second unit cell 22B is connected in parallel to the first unit cell 22A. Specifically, the second unit cell 22B is connected in parallel to the first unit cell 22A in the form of drain common, source common, and gate common.

The first unit cell 22A may include any one or more unit cells 22 selected from an aggregate of the plurality of unit cells 22, and an arrangement (layout after the selection) of the first unit cell 22A is optional. Similarly, the second unit cell 22B may include any one or more unit cells 22 selected from the aggregate of the plurality of unit cells 22, and an arrangement (layout after the selection) of the second unit cell 22B is optional. Specifically, the second unit cell 22B includes unit cells 22 other than the first unit cell 22A.

A first composition ratio R1 of the first unit cell 22A occupying the plurality of unit cells 22 and a second composition ratio R2 of the second unit cell 22B occupying the plurality of unit cells 22 are optional. The first composition ratio R1 and the second composition ratio R2 may be equal (R1=R2). That is, the plurality of unit cells 22 may include the first unit cells 22A of a first number and the second unit cell 22B of a second number equal to the first number.

The second composition ratio R2 may be less than the first composition ratio R1 (R1>R2). That is, the plurality of unit cells 22 may include the first unit cell 22A of a first number and the second unit cell 22B of a second number less than the first number. The second composition ratio R2 may exceed the first composition ratio R1 (R1<R2). That is, the plurality of unit cells 22 may have the first unit cell 22A of a first number and the second unit cell 22B of a second number exceeding the first number.

In this embodiment, a first group 41 including a group of a plurality of (twenty-one in this embodiments) first unit cells 22A is formed in the first cell region 12A. Further, a second group 42 including a group of a plurality of (twenty-one in this embodiment) second unit cells 22B is formed in the second cell region 12B. Further, a third group 43 including a group of a plurality of (five in this embodiment) first unit cells 22A is formed in the third cell region 12C.

Further, a fourth group 44 including a group of a plurality of (five in this embodiment) second unit cells 22B is formed in the fourth cell region 12D. That is, the first unit cell 22A of a first number (twenty-six in this embodiment) is formed in the first cell region 12A and the third cell region 12C, and the second unit cell 22B of a second number (twenty-six in this embodiment) equal to the first number is formed in the second cell region 12B and the fourth cell region 12D.

The electric signal applied to the second unit cell 22B is different from the electric signal applied to the first unit cell 22A, but the second unit cell 22B has a structure which is substantially the same as that of the first unit cell 22A. That is, the second unit cell 22B has constituent elements which are the same as those of the first unit cell 22A. In the following, in order to distinguish the constituent elements of the first unit cell 22A from the constituent elements of the second unit cell 22B, the gate structure 23 and the channel cell 24 of the first unit cell 22A are referred to as a "first gate structure 23A" and a "first channel cell 24A," respectively. The "first gate structure 23A" includes a first trench 25A, a first upper insulating film 26A, a first lower insulating film 27A, a first upper electrode 28A, a first lower electrode 29A, a first intermediate insulating film 30A, a first lead-out electrode 35A, and a first buried insulator 36A. The first upper insulating film 26A, the first lower insulating film 27A, and the first intermediate insulating film 30A are integrated to form one first insulator 31A. The "first channel cell 24A" includes a first source region 37A and a first channel 38A.

Further, in order to distinguish the constituent elements of the second unit cell 22B from the constituent elements of the first unit cell 22A, the gate structure 23 and the channel cell 24 of the second unit cell 22B are referred to as a "second gate structure 23B" and a "second channel cell 24B," respectively. The "second gate structure 23B" includes a second trench 25B, a second upper insulating film 26B, a second lower insulating film 27B, a second upper electrode 28B, a second lower electrode 29B, a second intermediate insulating film 30B, a second lead-out electrode 35B, and a second buried insulator 36B. The second upper insulating film 26B, the second lower insulating film 27B, and the second intermediate insulating film 30B are integrated to form one second insulator 31B. The "second channel cell 24B" includes a second source region 37B and a second channel 38B.

Referring to FIGS. 12 and 13, in the first unit cell 22A, a gate potential is applied to both the first upper electrode 28A and the first lower electrode 29A. As a result, the first upper electrode 28A and the first lower electrode 29A function as gate electrodes. In the first unit cell 22A, since the gate potential is applied to the first upper electrode 28A and the first lower electrode 29A, a voltage drop between the first upper electrode 28A and the first lower electrode 29A is suppressed. Therefore, electric field concentration between the first upper electrode 28A and the first lower electrode 29A is suppressed.

When the gate potential is applied to the first lower electrode 29A, electric charges (specifically, electrons of majority carriers) in the drift region 8 are attracted to the vicinity of the first gate structure 23A. Therefore, in the first unit cell 22A, a resistance value in the drift region 8 decreases. As a result, the first unit cell 22A has a relatively low first on-resistance component Ron1. The first on-resistance component Ron1 is an element of the on-resistance Ron of the MISFET 2.

The first unit cell 22A has a first capacitance component C1 between the first upper electrode 28A and the drift region 8 and a second capacitance component C2 between the first lower electrode 29A and the drift region 8. The second facing area between the first lower electrode 29A and the drift region 8 exceeds the first facing area between the first upper electrode 28A and the drift region 8. The second capacitance component C2 exceeds the first capacitance component C1 (C1<C2).

In the first unit cell 22A, a gate potential is applied to both the first upper electrode 28A and the first lower electrode 29A. Therefore, the second capacitance component C2 forms a parallel component with respect to the first capacitance component C1 between the gate and drain. As a result, the first unit cell 22A has a relatively high first feedback capacitance component Crss1 (=C1+C2), which is a combined capacitance of the first capacitance component C1 and the second capacitance component C2. The first feedback capacitance component Crss1 is an element of the feedback capacitance Crss of the MISFET 2. The feedback capacitance Crss is the gate-drain capacitance Cgd of the MISFET 2 and is also referred to as a reverse transmission capacitance.

On the other hand, in the second unit cell 22B, the gate potential is applied to the second upper electrode 28B, while a source potential is applied to the second lower electrode 29B. As a result, the second upper electrode 28B functions as a gate electrode, while the second lower electrode 29B functions as a source electrode (that is, a field electrode). Therefore, since the second unit cell 22B does not have characteristics of attracting electric charges to the vicinity of the second gate structure 23B by the function of the second lower electrode 29B, the second unit cell 22B has a second on-resistance component Ron2 higher than the first on-resistance component Ron1. The second on-resistance component Ron2 forms a parallel component with respect to the first on-resistance component Ron1. The second on-resistance component Ron2 is an element of the on-resistance Ron of the MISFET 2.

The second unit cell 22B has a first capacitance component C1 between the second upper electrode 28B and the drift region 8 and a second capacitance component C2 between the second lower electrode 29B and the drift region 8. In the second unit cell 22B, a gate potential is applied to the second upper electrode 28B, and a source potential is applied to the second lower electrode 29B. Therefore, in the second unit cell 22B, the first capacitance component C1 is a gate-drain capacitance, and the second capacitance component C2 (C1<C2) is a source-drain capacitance.

That is, the second unit cell 22B has a second feedback capacitance component Crss2 (=C1), which is the first capacitance component C1. The second feedback capacitance component Crss2 (=C1) is less than the first feedback capacitance component Crss1 (=C1+C2) (Crss2<Crss1). The second feedback capacitance component Crss2 forms a parallel component with respect to the first feedback capacitance component Crss1. The second feedback capacitance component Crss2 is an element of the feedback capacitance Crss of the MISFET 2.

The on-resistance Ron of the MISFET 2 is determined by a combined resistance of the first on-resistance component Ron1 of the plurality of first unit cells 22A and the second on-resistance component Ron2 of the plurality of second unit cells 22B. The feedback capacitance Crss of the MISFET 2 is determined by a combined capacitance of the first feedback capacitance component Crss1 of the plurality of first unit cells 22A and the second feedback capacitance component Crss2 of the plurality of second unit cells 22B.

Referring to FIGS. 4 to 11, the semiconductor device 1 includes a plurality of contact holes 51 respectively formed on sides of the plurality of unit cells 22 in the first main surface 4. Specifically, the plurality of contact holes 51 are formed in a region between the pair of unit cells 22 (the gate structure 23) that are adjacent to each other on the first main surface 4. Each contact hole 51 is dug down from the first main surface 4 to the second main surface 5 and exposes the source region 37 of the unit cell 22 located on one side and the source region 37 of the unit cell 22 located on the other side.

Each contact hole 51 is formed in the second direction Y to such a depth that it faces the upper electrode 28 of each gate structure 23. Each contact hole 51 has a bottom wall formed on the side of the first main surface 4 at an interval from the bottom portion of the body region 21. In this embodiment, a bottom wall of each contact hole 51 is formed at a depth position between the bottom portion of the body region 21 and a bottom portion of the source region 37. Each contact hole 51 is formed in a stripe shape extending along the gate structure 23 (the unit cell 22). That is, the plurality of contact holes 51 are formed alternately with the plurality of gate structures 23 in the second direction Y in a manner that one gate structure 23 is interposed therebetween. A length of the contact hole 51 with respect to the first direction X may be less than a length of the gate structure 23.

The semiconductor device 1 includes a plurality of p-type contact regions 52 formed in a region along the plurality of contact holes 51 in the surface layer of the body region 21. Each contact region 52 has the p-type impurity concentration that exceeds the p-type impurity concentration of the body region 21. The p-type impurity concentration of the contact region 52 may be $1\times10^{18}$ cm$^{-3}$ or more and $1\times10^{21}$ cm$^{-3}$ or less. Specifically, each contact region 52 is formed in a region along the bottom wall of the contact hole 51 in the surface layer of the body region 21. Each contact region 52 is formed on the side of the bottom wall of each contact hole 51 at an interval from the bottom portion of the body region 21. Each contact region 52 covers the entire region of the bottom wall of each contact hole 51. Each contact region 52 may cover a sidewall of each contact hole 51. Each contact region 52 is electrically connected to a plurality of source regions 37.

The semiconductor device 1 includes a plurality of buried electrodes 53 buried in the plurality of contact holes 51. Each buried electrode 53 is electrically connected to the source region 37 and the contact region 52 in each contact hole 51. In this embodiment, each buried electrode 53 has a laminated structure including a first electrode film 54 and a second electrode film 55 laminated in this order from the side of the semiconductor chip 3. The first electrode film 54 is formed in a film shape on an inner wall of the contact hole 51. The first electrode film 54 includes at least one selected from the group of a titanium film and a titanium nitride film. The second electrode film 55 is buried in the contact hole 51 with the first electrode film 54 interposed therebetween. The second electrode film 55 contains at least one selected from the group of copper, aluminum, and tungsten.

The semiconductor device 1 includes an interlayer insulating film 61 that covers the first main surface 4. The interlayer insulating film 61 may have a laminated structure in which a plurality of insulating films are laminated, or may have a single-layer structure including a single insulating film. The interlayer insulating film 61 may include at least one selected from the group of a silicon oxide film and a silicon nitride film. The interlayer insulating film 61 collectively covers a plurality of unit cells 22 on the first main surface 4. The interlayer insulating film 61 further enters the recess 34 of the trench 25 from above the first main surface 4. That is, in this embodiment, the above-mentioned buried insulator 36 is formed by a portion of the interlayer insulating film 61 located in the recess 34.

The interlayer insulating film 61 has a plurality of source openings 62 each exposing a region between a pair of gate structures 23 that are adjacent to each other on the first main surface 4. Specifically, each source opening 62 exposes the entire region of the mesa portion 39 in a cross-sectional view. That is, each source opening 62 exposes the entire region of the source region 37 and the entire region of the buried electrode 53 in the cross-sectional view. Referring to FIGS. 3, 8, and 9, the semiconductor device 1 includes a plurality of first connection electrodes 71 and a plurality of second connection electrodes 72 that are buried in the interlayer insulating film 61. The plurality of first connection electrodes 71 are each formed in a region on the side of the one end portion 25$f$ (an outer side of the first main surface 4) of a plurality of first gate structures 23A, and is not formed in a region on the side of the other end portion 25$g$ (an inner side of the first main surface 4) of the plurality of first gate structures 23A. The plurality of second connection electrodes 72 are each formed in the region on the side of the one end portion 25$f$ (the outer side of the first main surface 4) of the plurality of first gate structures 23A, and is not formed in the region on the side of the other end portion 25$g$ (the inner side of the first main surface 4) of the plurality of first gate structures 23A.

The plurality of first connection electrodes 71 penetrate the interlayer insulating film 61 and are electrically connected to the first upper electrodes 28A of the plurality of first gate structures 23A, respectively. That is, the plurality of first connection electrodes 71 overlap the plurality of first gate structures 23A in the normal direction Z. As a result, a wiring resistance between the first connection electrode 71 and the first gate structure 23A may be reduced. In this embodiment, the plurality of first connection electrodes 71 are connected to a plurality of first upper electrodes 28A in a one-to-one correspondence relationship. The plurality of first connection electrodes 71 are arranged in a row in the second direction Y in a plan view.

The plurality of second connection electrodes 72 penetrate the interlayer insulating film 61 and are electrically connected to the first lower electrodes 29A of the plurality of first gate structures 23A, respectively. Specifically, the plurality of second connection electrodes 72 are connected to a plurality of first lead-out electrodes 35A in a one-to-one correspondence relationship. That is, the plurality of second connection electrodes 72 overlap the plurality of first gate structures 23A in the normal direction Z. As a result, a wiring resistance between the second connection electrode 72 and the first gate structure 23A may be reduced. The plurality of second connection electrodes 72 are arranged in a row in the second direction Y in a plan view and face the plurality of first connection electrodes 71 in the first direction X.

Referring to FIGS. 3, 10, and 11, the semiconductor device 1 includes a plurality of third connection electrodes 73 and a plurality of fourth connection electrodes 74 that are buried in the interlayer insulating film 61. The plurality of third connection electrodes 73 are each formed in a region on the side of the one end portion 25*f* (the outer side of the first main surface 4) of the plurality of second gate structures 23B, and is not formed in a region on the side of the other end portion 25*g* (the inner side of the first main surface 4) of the plurality of second gate structures 23B. The plurality of fourth connection electrodes 74 are formed in the region on the side of the other end portion 25*g* (the inner side of the first main surface 4) of the plurality of second gate structures 23B, and is not formed in the region on the side of the one end portion 25*f* (the outer side of the first main surface 4) of the plurality of second gate structures 23B.

The plurality of third connection electrodes 73 penetrate the interlayer insulating film 61 and are electrically connected to the second upper electrodes 28B of the plurality of second gate structures 23B, respectively. That is, the plurality of third connection electrodes 73 overlap the plurality of second gate structures 23B in the normal direction Z. As a result, a wiring resistance between the third connection electrode 73 and the second gate structure 23B may be reduced. In this embodiment, the plurality of third connection electrodes 73 are connected to the plurality of second upper electrodes 28B in a one-to-one correspondence relationship. The plurality of third connection electrodes 73 are arranged in a row in the second direction Y in a plan view and face the plurality of first connection electrodes 71 and the plurality of second connection electrodes 72 in the first direction X.

The plurality of fourth connection electrodes 74 penetrate the interlayer insulating film 61 and are electrically connected to the second lower electrodes 29B of the plurality of second gate structures 23B, respectively. Specifically, the plurality of fourth connection electrodes 74 are connected to a plurality of second lead-out electrodes 35B in a one-to-one correspondence relationship. That is, the plurality of fourth connection electrodes 74 overlap the plurality of second gate structures 23B in the normal direction Z. As a result, a wiring resistance between the fourth connection electrode 74 and the second gate structure 23B may be reduced. The plurality of fourth connection electrodes 74 are arranged in a row in the second direction Y in a plan view and face the plurality of first connection electrodes 71, the plurality of second connection electrodes 72, and the plurality of third connection electrodes 73 in the first direction X.

In this embodiment, the first to fourth connection electrodes 71 to 74 have a laminated structure including the first electrode film 75 and the second electrode film 76 laminated in this order from the side of the semiconductor chip 3. The first electrode film 75 is formed in a film shape on inner walls of openings for the first to fourth connection electrodes 71 to 74. The first electrode film 75 includes at least one selected from the group of a titanium film and a titanium nitride film. The second electrode film 76 is buried in the openings for the first to fourth connection electrodes 71 to 74 with the first electrode film 75 interposed therebetween. The second electrode film 76 contains at least one selected from the group of copper, aluminum, and tungsten.

The semiconductor device 1 includes a gate pad electrode 81 (gate pad), a gate wiring electrode 82 (gate wiring), and a source pad electrode 83 (source pad) that are formed on the interlayer insulating film 61. The gate pad electrode 81 is an external terminal externally connected to a conductive wire (for example, a bonding wire), and a gate potential is applied to the gate pad electrode 81. The gate pad electrode 81 is disposed on a portion in the interlayer insulating film 61 that covers the inactive region 13.

Specifically, the gate pad electrode 81 is disposed on the pad region 15. The gate pad electrode 81 faces the pad region 15 with the interlayer insulating film 61 interposed therebetween. The gate pad electrode 81 may have a planar area smaller than that of the pad region 15. The gate pad electrode 81 does not face the plurality of unit cells 22 (the gate structure 23) in a plan view. In this embodiment, the gate pad electrode 81 is formed in a square shape in a plan view.

The gate wiring electrode 82 is drawn out from the gate pad electrode 81 onto the interlayer insulating film 61. The gate wiring electrode 82 transmits a gate potential applied to the gate pad electrode 81 to another region. The gate wiring electrode 82 extends in a stripe shape along a peripheral edge of the first main surface 4 so as to partition an inside of the first main surface 4 from a plurality of directions in a plan view. In this embodiment, the gate wiring electrode 82 has a stripe shape (specifically, a square annular shape) along the first to fourth side surfaces 6A to 6D so as to partition the inside of the first main surface 4 from four directions in a plan view. The gate wiring electrode 82 may extend in a stripe shape along the first side surface 6A, the third side surface 6C, and the fourth side surface 6D so as to partition the inside of the first main surface 4 from three directions in a plan view.

The gate wiring electrode 82 extends in a stripe shape so as to intersect (specifically, be orthogonal to) the plurality of unit cells 22 in a plan view. Specifically, the gate wiring electrode 82 intersects (specifically, is orthogonal to) one end portion 25*f* of the plurality of first gate structures 23A and one end portion 25*f* of the plurality of second gate structures 23B in a plan view. The gate wiring electrode 82 is electrically connected to the plurality of first connection electrodes 71, the plurality of second connection electrodes 72, and the plurality of third connection electrodes 73 on the interlayer insulating film 61.

The gate wiring electrode 82 faces the plurality of second lead-out electrodes 35B with the interlayer insulating film 61 interposed therebetween. Therefore, the gate wiring electrode 82 is electrically isolated from the plurality of second lower electrodes 29B (second lead-out electrodes 35B). As a result, the gate potential applied to the gate pad electrode 81 is transmitted to the first upper electrode 28A and the first lower electrode 29A of the plurality of first gate structures 23A and the second upper electrode 28B of the plurality of second gate structures 23B.

The source pad electrode 83 is an external terminal externally connected to a conductive wire (for example, a bonding wire), and a source potential is applied to the source pad electrode 83. The source pad electrode 83 is disposed in a region partitioned by the gate pad electrode 81 and the gate wiring electrode 82 in the interlayer insulating film 61 and faces the active region 10. In this embodiment, the source pad electrode 83 has a recess 84 recessed from a central portion of a side along the first side surface 6A toward an inner portion of the source pad electrode 83 so as to be aligned with the gate pad electrode 81 in a plan view. The source pad electrode 83 faces all of the plurality of first unit cells 22A and all of the plurality of second unit cells 22B.

The source pad electrode 83 enters the plurality of source openings 62 from above the interlayer insulating film 61. The source pad electrode 83 is electrically connected to the plurality of source regions 37 and the plurality of buried electrodes 53 in the plurality of source openings 62. Further, the source pad electrode 83 is electrically connected to the plurality of fourth connection electrodes 74 on the interlayer insulating film 61. The source pad electrode 83 faces the plurality of first upper electrodes 28A, the plurality of first lead-out electrodes 35A, and the plurality of second upper electrodes 28B with the interlayer insulating film 61 interposed therebetween. Therefore, the source pad electrode 83 is electrically isolated from the plurality of first upper electrodes 28A, the plurality of first lower electrodes 29A (first lead-out electrodes 35A), and the plurality of second upper electrodes 28B. As a result, the source potential applied to the source pad electrode 83 is transmitted to the plurality of source regions 37, the plurality of buried electrodes 53, and the second lower electrodes 29B of the plurality of second gate structures 23B.

In this embodiment, the gate pad electrode 81, the gate wiring electrode 82, and the source pad electrode 83 each have a laminated structure including a first electrode film 85 and a second electrode film 86 laminated in this order from the side of the semiconductor chip 3. The first electrode film 85 is formed in a film shape along an outer surface of the interlayer insulating film 61. The first electrode film 85 includes at least one selected from the group of a titanium film and a titanium nitride film. The second electrode film 86 is formed in a film shape on the first electrode film 85. The second electrode film 86 may include at least one selected from the group of a pure Al film, a pure Cu film, an AlCu alloy film, an AlSiCu alloy film, and an AlSi alloy film.

The semiconductor device 1 includes a drain electrode 87 that covers the second main surface 5 of the semiconductor chip 3. The drain electrode 87 is an external terminal connected externally, and a drain potential is applied to the drain electrode 87. The drain electrode 87 forms an ohmic contact with the drain region 7. The drain electrode 87 may include at least one selected from the group of a Ti film, a Ni film, an Au film, an Ag film, and an Al film. The drain electrode 87 may have a laminated structure in which at least two selected from the group of a Ti film, a Ni film, an Au film, an Ag film, and an Al film are laminated in any order.

Figure 14:
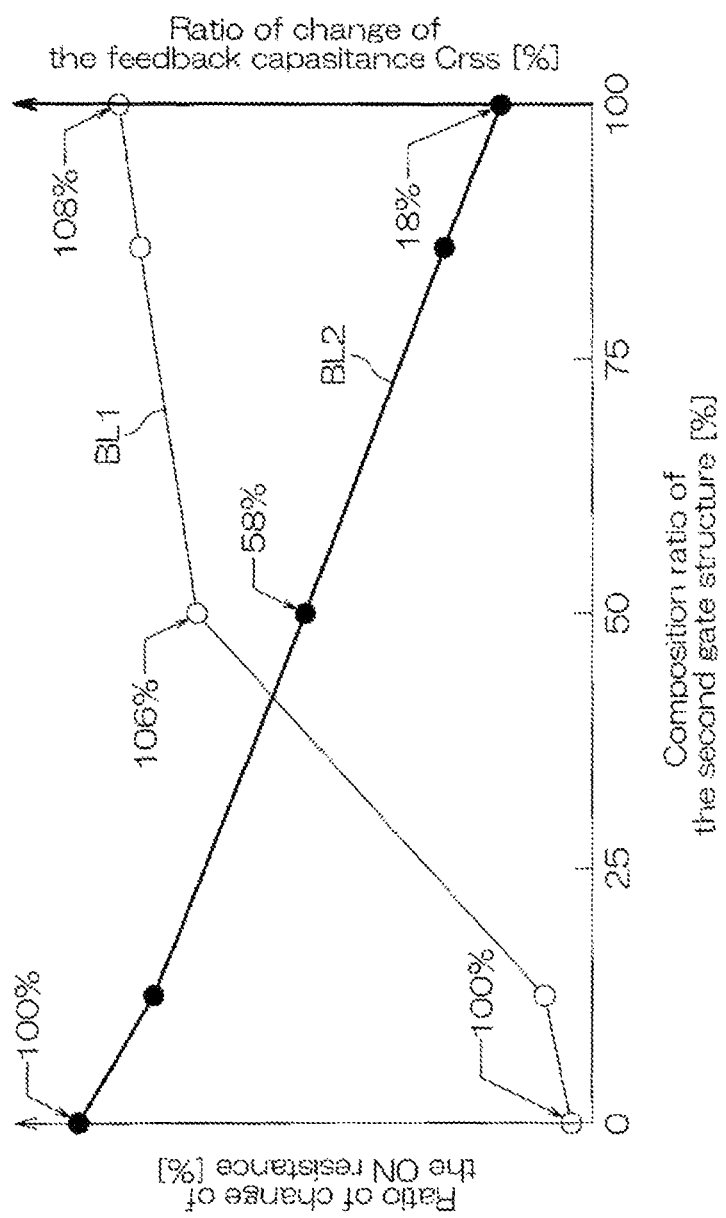
FIG. 14 is a graph showing a relationship between on-resistance and feedback capacitance of a MISFET when a composition ratio of a second gate structure is adjusted.

FIG. 14 is a graph showing a relationship between the on-resistance Ron and the feedback capacitance Crss of the MISFET 2 when the second composition ratio R2 of the second gate structure 23B is adjusted. The vertical axis on the right side of FIG. 14 represents a ratio of change [%] in the on-resistance Ron of the MISFET 2. The vertical axis on the left side of FIG. 14 represents a ratio of change [%] in the feedback capacitance Crss of the MISFET 2. The horizontal axis of FIG. 14 represents the second composition ratio R2 [%] of the second unit cell 22B.

FIG. 14 shows a first polygonal line BL1 (thin line) and a second polygonal line BL2 (thick line). The first polygonal line BL1 indicates the ratio of change in the on-resistance Ron with respect to the second composition ratio R2, and the second polygonal line BL2 indicates the ratio of change in the feedback capacitance Crss with respect to the second composition ratio R2. Referring to the first polygonal line BL1, when the second composition ratio R2 is increased, the on-resistance Ron increases. This is because the second on-resistance component Ron2 of the second unit cell 22B exceeds the first on-resistance component Ron1 of the first unit cell 22A. On the other hand, referring to the second polygonal line BL2, when the second composition ratio R2 is increased, the feedback capacitance Crss decreases. This is because the second feedback capacitance component Crss2 of the second unit cell 22B is less than the first feedback capacitance component Crss1 of the first unit cell 22A.

Referring to the first polygonal line BL1 and the second polygonal line BL2, the ratio of change in the on-resistance Ron is about 8% at the maximum, while the ratio of change in the feedback capacitance Crss is about 82% at the maximum. That is, it has been found that the ratio of change in the feedback capacitance Crss due to the change in the second composition ratio R2 is much larger than the ratio of change in the on-resistance Ron due to the change in the second composition ratio R2. From the result of FIG. 14, it has been found that according to a mixed structure of the first unit cell 22A and the second unit cell 22B, the feedback capacitance Crss can be reduced while suppressing the increase of the on-resistance Ron. Further, it has been found that the feedback capacitance Crss can be adjusted in a relatively wide range while suppressing the increase of the on-resistance Ron by adjusting the second composition ratio R2 of the second unit cell 22B.

The on-resistance Ron and the feedback capacitance Crss of the MISFET 2 may be adjusted by adjusting impurity concentration of a semiconductor region (for example, the drift region 8, the body region 21, the source region 37, and the like) in the semiconductor chip 3. Further, the on-resistance Ron and the feedback capacitance Crss of the MISFET 2 may be adjusted by adjusting thicknesses and the like of the upper insulating film 26, the lower insulating film 27, the upper electrode 28, the lower electrode 29, and the intermediate insulating film 30 included in the gate structure 23. However, in this case, a significant design change of the existing manufacturing method is unavoidable due to a change in the impurity concentration and a design value of the gate structure 23.

Therefore, in this embodiment, the semiconductor device 1 including the semiconductor chip 3, the n-type drift region 8, the p-type body region 21, the first gate structure 23A, the first source region 37A, the second gate structure 23B, and the second source region 37B is adopted. The semiconductor chip 3 has the first main surface 4. The drift region 8 is formed on the surface layer of the first main surface 4. The body region 21 is formed on the surface layer of the drift region 8.

The first gate structure 23A includes the first upper electrode 28A and the first lower electrode 29A buried in the vertical direction with the first insulator 31A interposed therebetween in the first trench 25A formed on the first main surface 4 so as to penetrate the body region 21. In the first gate structure 23A, the gate potential is applied to each of the first upper electrode 28A and the first lower electrode 29A. The first source region 37A is formed in the region along the first gate structure 23A in the surface layer of the body region 21 and forms the first channel 38A between the drift region 8 and the first source region 37A.

The second gate structure 23B includes the second upper electrode 28B and the second lower electrode 29B buried in the second trench 25B formed on the first main surface 4 in the vertical direction with the second insulator 31B interposed therebetween so as to penetrate the body region 21. In the second gate structure 23B, the gate potential is applied to the first upper electrode 28A, while the source potential is applied to the first lower electrode 29A. The second source region 37B is formed in the region along the second gate structure 23B in the surface layer of the body region 21 and forms the second channel 38B with the drift region 8 and the second source region 37B. That is, the basic structure of the second gate structure 23B is substantially the same as the basic structure of the first gate structure 23A.

In the semiconductor device 1, the first unit cell 22A including the first gate structure 23A and the first channel 38A is configured, and the second unit cell 22B including the second gate structure 23B and the second channel 38B is configured. The basic structure of the second unit cell 22B is substantially the same as the basic structure of the first unit cell 22A. In the first unit cell 22A, the gate potential is applied to both the first upper electrode 28A and the first lower electrode 29A. As a result, the first upper electrode 28A and the first lower electrode 29A function as gate electrodes. In the first unit cell 22A, since the gate potential is applied to the first upper electrode 28A and the first lower electrode 29A, a voltage drop between the first upper electrode 28A and the first lower electrode 29A is suppressed. Therefore, the electric field concentration between the first upper electrode 28A and the first lower electrode 29A is suppressed.

When the gate potential is applied to the first lower electrode 29A, electric charges (specifically, electrons of majority carriers) in the drift region 8 are attracted to the vicinity of the first gate structure 23A. Therefore, a resistance value in the drift region 8 decreases. As a result, the first unit cell 22A has a relatively low first on-resistance component Ron1. The first on-resistance component Ron1 is an element of the on-resistance Ron of the MISFET 2.

On the other hand, the first unit cell 22A has the first capacitance component C1 between the first upper electrode 28A and the drift region 8 and the second capacitance component C2 between the first lower electrode 29A and the drift region 8. The second capacitance component C2 exceeds the first capacitance component C1 (C1<C2). In the first unit cell 22A, the gate potential is applied to both the first upper electrode 28A and the first lower electrode 29A.

Therefore, the second capacitance component C2 forms a parallel component with respect to the first capacitance component C1. The first unit cell 22A has the first feedback capacitance component Crss1 (=C1+C2) which is a combined capacitance of the first capacitance component C1 and the second capacitance component C2. The first feedback capacitance component Crss1 is an element of the feedback capacitance Crss of the MISFET 2. The feedback capacitance Crss is the gate-drain capacitance Cgd of the MISFET 2.

On the other hand, in the second unit cell 22B, the gate potential is applied to the second upper electrode 28B, while the source potential is applied to the second lower electrode 29B. As a result, the second upper electrode 28B functions as a gate electrode, while the second lower electrode 29B functions as a source electrode (field electrode). That is, the plurality of unit cells 22 have a composite structure including the first unit cell 22A and the second unit cell 22B to which different electric signals are applied.

Since the second unit cell 22B does not have the characteristics of attracting electric charges in the vicinity of the second gate structure 23B by the function of the second lower electrode 29B, the second unit cell 22B has the second on-resistance component Ron2 higher than the first on-resistance component Ron1. The second on-resistance component Ron2 forms a parallel component with respect to the first on-resistance component Ron1. The second on-resistance component Ron2 is an element of the on-resistance Ron of the MISFET 2.

On the other hand, the second unit cell 22B has the first capacitance component C1 between the second upper electrode 28B and the drift region 8 and the second capacitance component C2 between the second lower electrode 29B and the drift region 8. In the second unit cell 22B, the gate potential is applied to the second upper electrode 28B, and the source potential is applied to the second lower electrode 29B. Therefore, in the second unit cell 22B, the first capacitance component C1 is the gate-drain capacitance, and the second capacitance component C2 is the source-drain capacitance.

That is, the second unit cell 22B has a second feedback capacitance component Crss2 (=C1) which is the first capacitance component C1. The second feedback capacitance component Crss2 (=C1) is less than the first feedback capacitance component Crss1 (=C1+C2) (Crss2<Crss1). The second feedback capacitance component Crss2 forms a parallel component with respect to the first feedback capacitance component Crss1. The second feedback capacitance component Crss2 is an element of the feedback capacitance Crss of the MISFET 2.

From another point of view, referring to FIGS. 12 and 13, the semiconductor device 1 includes the MISFET 2 formed on the semiconductor chip 3. The MISFET 2 includes an aggregate of a plurality of unit cells 22. Specifically, the plurality of unit cells 22 include at least one first unit cell 22A and at least one second unit cell 22B. The first unit cell 22A has the first on-resistance component Ron1 and the first feedback capacitance component Crss1. The second unit cell 22B has the second on-resistance component Ron2 and the second feedback capacitance component Crss2. The second on-resistance component Ron2 forms a parallel component with respect to the first on-resistance component Ron1 and has a value exceeding the first on-resistance component Ron1. The second feedback capacitance component Crss2 forms a parallel component with respect to the first feedback capacitance component Crss1 and has a value smaller than that of the first feedback capacitance component Crss1.

The second on-resistance component Ron2 of the second unit cell 22B exceeds the first on-resistance component Ron1 of the first unit cell 22A. For example, the on-resistance Ron of the MISFET 2 including one first unit cell 22A and one second unit cell 22B is higher than the on-resistance Ron of the MISFET 2 including only two first unit cells 22A. However, the second on-resistance component Ron2 forms a parallel component with respect to the first on-resistance component Ron1. Therefore, since the combined resistance of the first on-resistance component Ron1 and the second on-resistance component Ron2 is theoretically lower than the first on-resistance component Ron1, a large increase in the on-resistance Ron is suppressed.

On the other hand, the second feedback capacitance component Crss2 of the second unit cell 22B is less than the first feedback capacitance component Crss1 of the first unit cell 22A. The second feedback capacitance component Crss2 forms a parallel component with respect to the first feedback capacitance component Crss1. For example, the feedback capacitance Crss of the MISFET 2 including one first unit cell 22A and one second unit cell 22B is theoretically less than the feedback capacitance Crss of the MISFET 2 including only two first unit cells 22A by a difference between the first feedback capacitance component Crss1 and the second feedback capacitance component Crss2.

As a result, the feedback capacitance Crss may be reduced while suppressing the increase in the on-resistance Ron (see also the first and second polygonal lines BL1 and BL2 in FIG. 14). Therefore, according to the semiconductor device 1, switching descent time may be shortened while suppressing the increase in power consumption. Further, it is possible to provide the semiconductor device 1 including the MISFET 2 having a mixed structure of the first unit cell 22A and the second unit cell 22B without significantly changing the existing manufacturing method.

The semiconductor device 1 includes the active region 10 set in the semiconductor chip 3. In this structure, the first unit cell 22A and the second unit cell 22B are formed in the active region 10. That is, the mixed structure of the first unit cell 22A and the second unit cell 22B is formed in the common active region 10. Therefore, since the first unit cell 22A and the second unit cell 22B may not be formed in separate regions, it is possible to contribute to shrinking (miniaturization) of the semiconductor device 1. Further, as a result, a wiring distance to the first unit cell 22A and the second unit cell 22B may be shortened, so that an increase in wiring resistance (on resistance Ron) may be appropriately suppressed.

In this case, the semiconductor device 1 may particularly include the single active region 10. According to this structure, the mixed structure of the first unit cell 22A and the second unit cell 22B is formed in the single active region 10, and therefore fluctuations in the electrical characteristics of the MISFET 2 due to structures outside the active region 10 may be suppressed. Further, according to this structure, the semiconductor device 1 may be provided as a discrete device including the MISFET 2.

The semiconductor device 1 includes the interlayer insulating film 61, the gate pad electrode 81, the gate wiring electrode 82, and the source pad electrode 83. The interlayer insulating film 61 covers the first unit cell 22A (the first gate structure 23A) and the second unit cell 22B (the second gate structure 23B) on the first main surface 4. The gate pad electrode 81 is disposed on the interlayer insulating film 61. The gate wiring electrode 82 is drawn out from the gate pad electrode 81 onto the interlayer insulating film 61.

The gate wiring electrode 82 extends so as to intersect the first unit cell 22A (the first gate structure 23A) and the second unit cell 22B (the second gate structure 23B) in a plan view, and is electrically connected to the first unit cell 22A (the first gate structure 23A) and the second unit cell 22B (the second gate structure 23B). Specifically, the gate wiring electrode 82 is electrically connected to the first upper electrode 28A and the first lower electrode 29A of the first gate structure 23A and the second upper electrode 28B of the second gate structure 23B.

The source pad electrode 83 is disposed on the interlayer insulating film 61 at an interval from the gate pad electrode 81 and the gate wiring electrode 82. The source pad electrode 83 faces all the first unit cells 22A and all the second unit cells 22B in a plan view. The source pad electrode 83 is electrically connected to the first unit cell 22A (the first gate structure 23A) and the second unit cell 22B (the second gate structure 23B). Specifically, the source pad electrode 83 is electrically connected to the second lower electrode 29B of the second gate structure 23B.

According to such a structure, after the formation of the plurality of unit cells 22, by adjusting the connection form of the source pad electrode 83, the gate pad electrode 81, and the gate wiring electrode 82 to the plurality of unit cells 22, the first unit cell 22A and the second unit cell 22B may be formed in an arbitrary arrangement pattern. Such a structure is particularly effective when the semiconductor device 1 includes the single active region 10.

Figure 15:
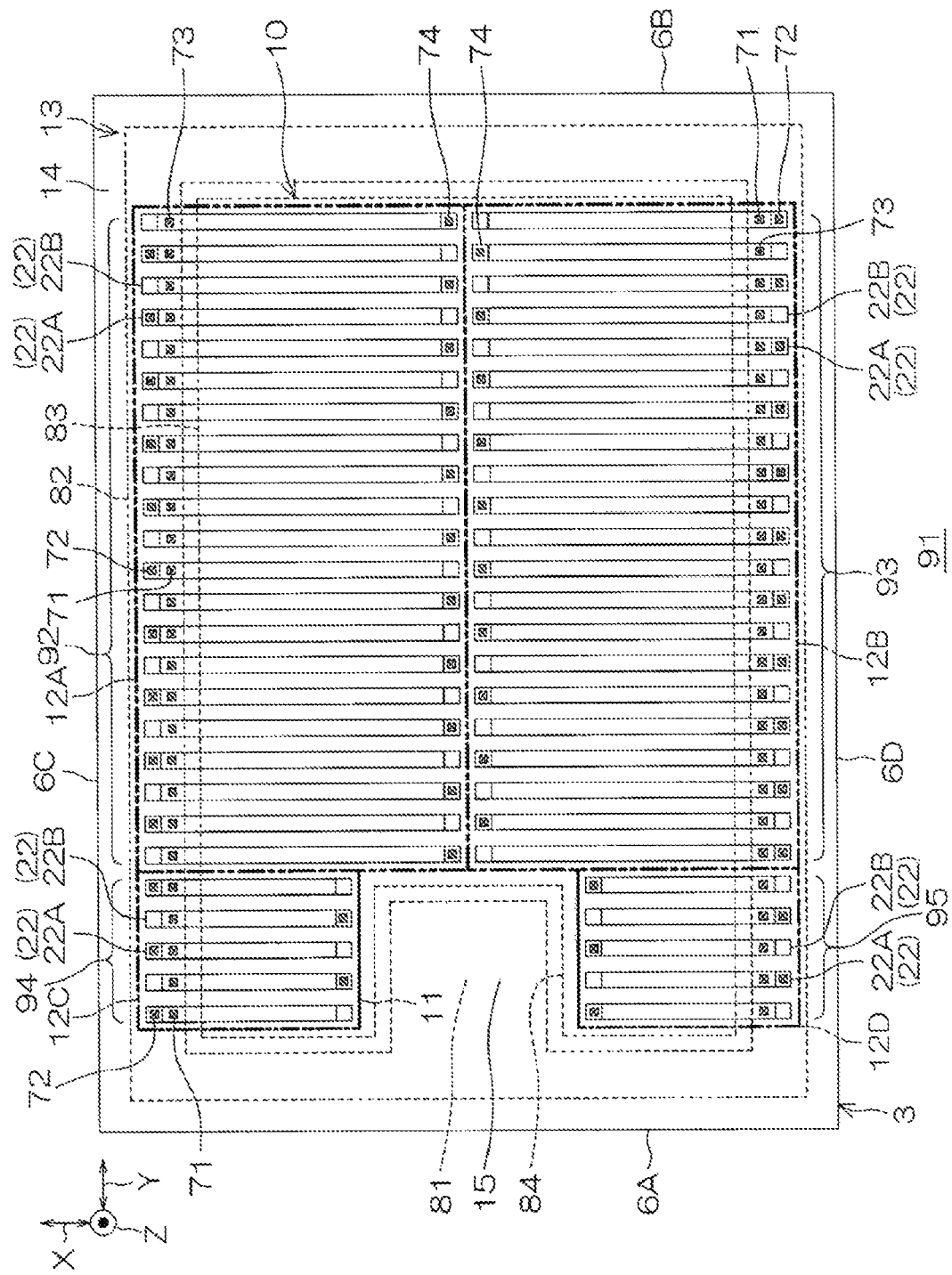
FIG. 15 corresponds to FIG. 3 and is a plan view showing a structure of a main surface of a semiconductor chip of a semiconductor device according to a second embodiment of the present disclosure (that is, showing a form of change in an arrangement of the first unit cell and an arrangement of the second unit cell in the semiconductor device according to the first embodiment).

FIG. 15 corresponds to FIG. 3 and is a plan view showing a structure of a first main surface 4 of a semiconductor chip 3 of a semiconductor device 91 according to a second embodiment of the present disclosure (that is, a form of change in the arrangement of the first unit cells 22A and the arrangement of the second unit cells 22B in the semiconductor device 1 according to the first embodiment). Hereinafter, structures corresponding to the structures described for the semiconductor device 1 are denoted by the same reference numerals and explanation thereof will be omitted.

In the above-described first embodiment, it has been explained that the arrangement of the first unit cell 22A and the second unit cell 22B is arbitrary. In the semiconductor device 91 according to the second embodiment, at least one first unit cell 22A and at least one second unit cell 22B are formed in each of the first to fourth cell regions 12A to 12D. A first group 92 is formed in the first cell region 12A. The first group 92 is a group including a plurality of first unit cells 22A and a plurality of second unit cells 22B alternately arranged in the second direction Y. A second group 93 is formed in the second cell region 12B. The second cell region 12B includes a group including a plurality of first unit cells 22A and a plurality of second unit cells 22B alternately arranged in the second direction Y.

A first group 94 is formed in the third cell region 12C. The third cell region 12C includes a group including a plurality of first unit cells 22A and a plurality of second unit cells 22B alternately arranged in the second direction Y. A second group 95 is formed in the fourth cell region 12D. The fourth cell region 12D includes a group including a plurality of first unit cells 22A and a plurality of second unit cells 22B alternately arranged in the second direction Y.

In this way, in the semiconductor device 91, the plurality of first unit cells 22A and the plurality of second unit cells 22B are alternately arranged in the second direction Y in each of the first to fourth cell regions 12A to 12D. That is, the plurality of second unit cells 22B face the first unit cells 22A in the second direction Y. FIG. 15 shows an example in which a plurality of second unit cells 22B face a plurality of first unit cells 22A in the first direction X as well.

Figure 16:
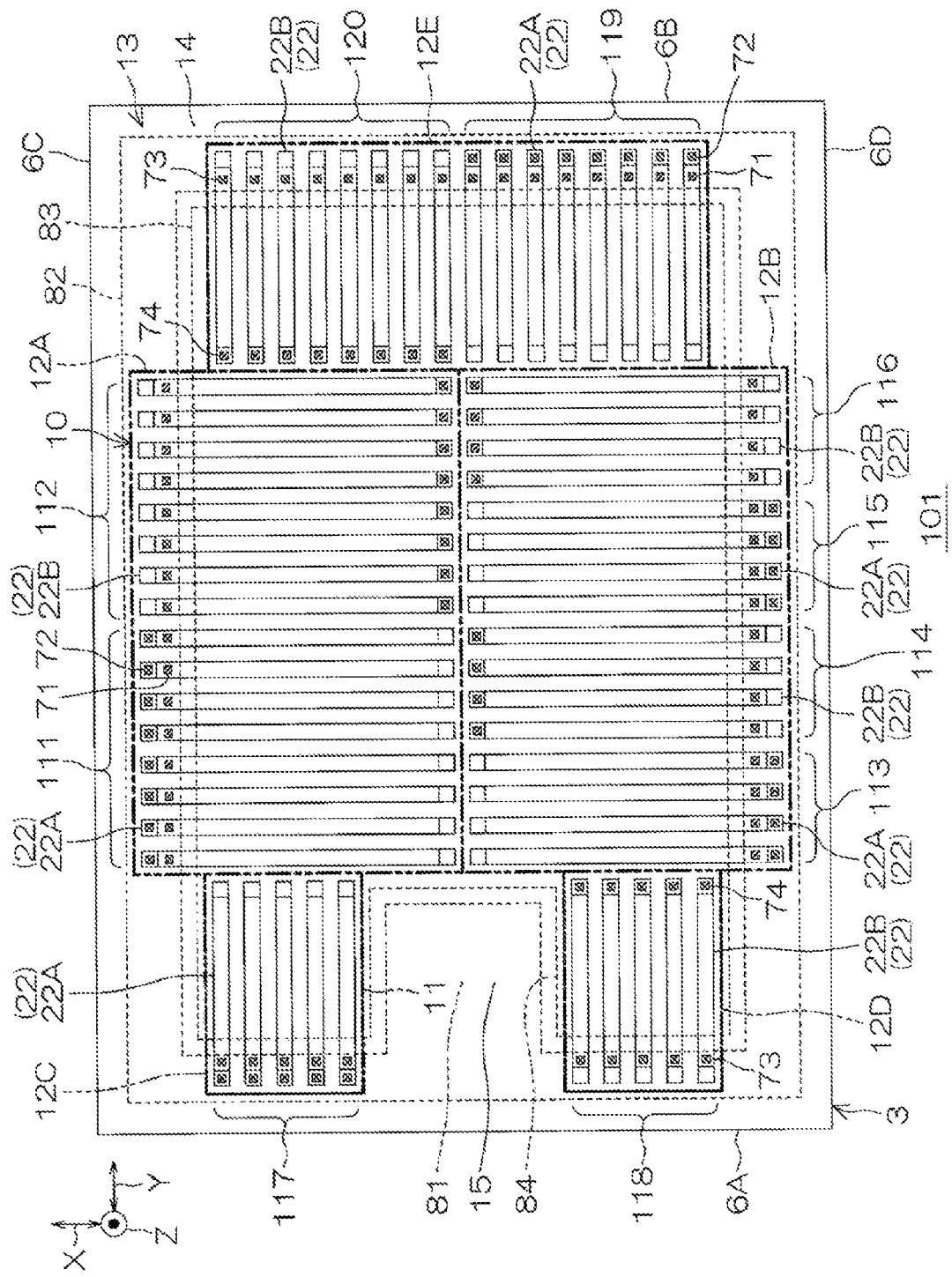
FIG. 16 corresponds to FIG. 3 and is a plan view showing a structure of a main surface of a semiconductor chip of a semiconductor device according to a third embodiment of the present disclosure (that is, showing a form of change in an arrangement of the plurality of cell regions, the arrangement of the first unit cell, and the arrangement of the second unit cell in the semiconductor device according to the first embodiment).

As described above, the semiconductor device 91 may also obtain the same effects as the semiconductor device 1. FIG. 16 corresponds to FIG. 3 and is a plan view showing a structure of a first main surface 4 of a semiconductor chip 3 of a semiconductor device 101 according to a third embodiment of the present disclosure (that is, a form of change in the arrangement of the cell regions 12, the arrangement of the first unit cells 22A, and the arrangement of the second unit cells 22B in the semiconductor device 1 according to the first embodiment). Hereinafter, structures corresponding to the structures described for the semiconductor device 1 are denoted by the same reference numerals and explanation thereof will be omitted.

In the semiconductor device 1 according to the first embodiment described above, the example where the active region 10 includes the first to fourth cell regions 12A to 12D has been described. On the other hand, in the semiconductor device 101 according to the third embodiment, the active region 10 includes a fifth cell region 12E in addition to the first to fourth cell regions 12A to 12D. The fifth cell region 12E is set in a region on the side of the second side surface 6B with respect to one or both of the first cell region 12A and the second cell region 12B. In this embodiment, the fifth cell region 12E is set in a region on the side of the second side surface 6B with respect to both the first cell region 12A and the second cell region 12B.

The plurality of unit cells 22 (the gate structure 23) are formed in each of the first to fifth cell regions 12A to 12E. The plurality of unit cells 22 (the gate structure 23) of the first cell region 12A are each formed in a stripe shape extending in the first direction X and are formed at intervals in the second direction Y. That is, the plurality of unit cells 22 of the first cell region 12A are formed in a stripe shape extending in the first direction X as a whole.

The plurality of unit cells 22 (the gate structure 23) of the second cell region 12B are each formed in a stripe shape extending in the first direction X and are formed at intervals in the second direction Y. That is, the plurality of unit cells 22 of the second cell region 12B are formed in a stripe shape extending in the first direction X as a whole. Further, the plurality of unit cells 22 of the second cell region 12B face the plurality of unit cells 22 in the first cell region 12A in a one-to-one correspondence relationship.

In this embodiment, the plurality of unit cells 22 (the gate structure 23) of the third cell region 12C extend in a direction different from that of the plurality of unit cells 22 of the first cell region 12A and the second cell region 12B. In this embodiment, the plurality of unit cells 22 of the third cell region 12C are each formed at intervals in the first direction X and are formed in a stripe shape extending in the second direction Y. That is, the plurality of unit cells 22 of the third cell region 12C are formed in a stripe shape extending in the second direction Y as a whole.

In this embodiment, the plurality of unit cells 22 (the gate structure 23) of the fourth cell region 12D extend in a direction different from that of the plurality of unit cells 22 of the first cell region 12A and the second cell region 12B. In this embodiment, the plurality of unit cells 22 of the fourth cell region 12D are each formed at intervals in the first direction X and are formed in a stripe shape extending in the second direction Y. That is, the plurality of unit cells 22 of the fourth cell region 12D are formed in a stripe shape extending in the second direction Y as a whole. Further, the plurality of unit cells 22 of the fourth cell region 12D extend in the same direction as the plurality of unit cells 22 of the third cell region 12C.

In this embodiment, the plurality of unit cells 22 (the gate structure 23) of the fifth cell region 12E extend in a direction different from that of the plurality of unit cells 22 of the first cell region 12A and the second cell region 12B. In this embodiment, the plurality of unit cells 22 of the fifth cell region 12E are each formed at intervals in the first direction X and are formed in a stripe shape extending in the second direction Y. That is, the plurality of unit cells 22 of the fifth cell region 12E are formed in a stripe shape extending in the second direction Y as a whole. Further, the plurality of unit cells 22 of the fifth cell region 12E extend in the same direction as the plurality of unit cells 22 of the third cell region 12C and the fourth cell region 12D.

A first group 111 and a second group 112 are formed in the first cell region 12A. The first group 111 is formed in a region on the side of the first side surface 6A in the first cell region 12A. The second group 112 is formed in a region on the side of the second side surface 6B in the first cell region 12A. The first group 111 is a group of a plurality of (eight in this embodiment) first unit cells 22A. The second group 112 is a group of a plurality of (eight in this embodiment) second unit cells 22B.

A third group 113, a fourth group 114, a fifth group 115, and a sixth group 116 are formed in the second cell region 12B. The third to sixth groups 113 to 116 are formed in this order from the side of the first side surface 6A to the side of the second side surface 6B in the second cell region 12B. The third group 113 is a group of a plurality of (four in this embodiment) first unit cells 22A. The fourth group 114 is a group of a plurality of (four in this embodiment) second unit cells 22B. The fifth group 115 is a group of a plurality of (four in this embodiment) first unit cells 22A. The sixth group 116 is a group of a plurality of (four in this embodiment) second unit cells 22B.

A seventh group 117 is formed in the third cell region 12C. The seventh group 117 is a group of a plurality of (five in this embodiment) first unit cells 22A. An eighth group 118 is formed in the fourth cell region 12D. The eighth group 118 is a group of a plurality of (five in this embodiment) second unit cells 22B. A ninth group 119 and a tenth group 120 are formed in the fifth cell region 12E. The ninth group 119 is formed in a region on the side of the fourth side surface 6D in the fifth cell region 12E. The tenth group 120 is formed in a region on the side of the third side surface 6C in the fifth cell region 12E. The ninth group 119 is a group of a plurality of (eight in this embodiment) first unit cells 22A. The tenth group 120 is a group of a plurality of (eight in this embodiment) second unit cells 22B.

In this way, the MISFET 2 includes the plurality of first unit cells 22A (the first gate structure 23A) extending in the first direction X, the plurality of first unit cells 22A (the first gate structure 23A) extending in the second direction Y, the plurality of second unit cells 22B (the second gate structure 23B) extending in the first direction X, and the plurality of second unit cells 22B (the second gate structure 23B) extending in the second direction Y. The MISFET 2 may include the plurality of first unit cells 22A (the first gate structure 23A) extending in the same direction. The MISFET 2 may include the plurality of second unit cells 22B (the second gate structure 23B) extending in the same direction. The MISFET 2 may include the first unit cells 22A (the first gate structure 23A) and the second unit cells 22B (the second gate structure 23B) extending in the same direction.

The MISFET 2 may include the plurality of first unit cells 22A (the first gate structure 23A) extending in different directions. The MISFET 2 may include the plurality of second unit cells 22B (the second gate structure 23B) extending in different directions. The MISFET 2 may include the first unit cells 22A (the first gate structure 23A) and the second unit cells 22B (the second gate structure 23B) extending in different directions.

In the MISFET 2, another first unit cell 22A (the first gate structure 23A) may be formed at an interval in one direction from one first unit cell 22A (the first gate structure 23A) extending in the one direction along the first main surface 4. In this case, the another first unit cell 22A (the first gate structure 23A) may extend in the one direction or in an intersection direction intersecting the one direction. Further, in this case, the another first unit cell 22A (the first gate structure 23A) may face the one first unit cell 22A (the first gate structure 23A) in the one direction.

In the MISFET 2, another first unit cell 22A (the first gate structure 23A) may be formed at an interval in an intersection direction intersecting one direction along the first main surface 4 from one first unit cell 22A (the first gate structure 23A) extending in the one direction. In this case, the another first unit cell 22A (the first gate structure 23A) may extend in the one direction or in the intersection direction. Further, in this case, the another first unit cell 22A (the first gate structure 23A) may face the one first unit cell 22A (the first gate structure 23A) in the intersection direction.

In the MISFET 2, another second unit cell 22B (the second gate structure 23B) may be formed at an interval in one direction along the first main surface 4 from one second unit cell 22B (the second gate structure 23B) extending in the one direction. In this case, the another second unit cell 22B (the second gate structure 23B) may extend in the one direction or in an intersection direction intersecting the one direction. Further, in this case, the another second unit cell 22B (the second gate structure 23B) may face the one second unit cell 22B (the second gate structure 23B) in the one direction.

In the MISFET 2, another second unit cell 22B (the second gate structure 23B) may be formed at an interval in an intersection direction intersecting one direction along the first main surface 4 from one second unit cell 22B (the second gate structure 23B) extending in the one direction. In this case, the another second unit cell 22B (the second gate structure 23B) may extend in the one direction or in the intersection direction. Further, in this case, the another second unit cell 22B (the second gate structure 23B) may face the one second unit cell 22B (the second gate structure 23B) in the intersection direction.

In the MISFET 2, a second unit cell 22B (the second gate structure 23B) may be formed at an interval in one direction along the first main surface 4 from a first unit cell 22A (the first gate structure 23A) extending in the one direction. In this case, the second unit cell 22B (the second gate structure 23B) may extend in the one direction or in an intersection direction intersecting the one direction. Further, in this case, the second unit cell 22B (the second gate structure 23B) may face the first unit cell 22A (the first gate structure 23A) in the one direction.

In the MISFET 2, a second unit cell 22B (the second gate structure 23B) may be formed at an interval in an intersection direction intersecting one direction along the first main surface 4 from a first unit cell 22A (the first gate structure 23A) extending in the one direction. In this case, the second unit cell 22B (the second gate structure 23B) may extend in the one direction or in the intersection direction. Further, in this case, the second unit cell 22B (the second gate structure 23B) may face the first unit cell 22A (the first gate structure 23A) in the intersection direction.

In the above description, the "intersection direction" may be an orthogonal direction orthogonal to the "one direction." In the above description, the "one direction" may be the "first direction X" and the "intersection direction" may be the "second direction Y." In the above description, the "one direction" may be the "second direction Y" and the "intersection direction" may be the "first direction X." The gate wiring electrode 82 extends in a stripe shape so as to intersect (specifically, be orthogonal to) the plurality of unit cells 22 extending in the first direction X and the plurality of unit cells 22 extending in the second direction Y (the plurality of unit cells 22 forming the first to tenth groups 111 to 120) in a plan view. That is, one gate wiring electrode 82 intersects (specifically, is orthogonal to) the first unit cells 22A (the first gate structure 23A) extending in the first direction X, the first unit cells 22A (the first gate structure 23A) extending in the second direction Y, the second unit cells 22B (the second gate structure 23B) extending in the first direction X, and the second unit cells 22B (the second gate structure 23B) extending in the second direction Y.

The gate wiring electrode 82 intersects (specifically, is orthogonal to) the one end portion 25f of the plurality of first gate structures 23A and the one end portion 25f of the plurality of second gate structures 23B in a plan view. The gate wiring electrode 82 is electrically connected to the plurality of first connection electrodes 71, the plurality of second connection electrodes 72, and the plurality of third connection electrodes 73 on the interlayer insulating film 61. As a result, the gate potential applied to the gate pad electrode 81 is transmitted to the first upper electrode 28A and the first lower electrode 29A of the plurality of first gate structures 23A, and the second upper electrode 28B of the plurality of second gate structures 23B.

As described above, the semiconductor device 101 may also obtain the same effects as the semiconductor device 1. The number of cell regions 12, the number of groups included in the cell region 12, the types of unit cells 22 constituting the groups, the extension direction of the unit cells 22 in the cell region 12, and the like are all optional, and they may take various different forms other than the forms shown in FIG. 16. The present disclosure may be implemented in other embodiments.

The example in which the gate pad electrode 81 (the gate wiring electrode 82) separate from the plurality of first to third connection electrodes 71 to 73 is formed has been described in each of the above-described embodiments. However, a portion of the gate pad electrode 81 (the gate wiring electrode 82) may be buried in the interlayer insulating film 61, as the plurality of first to third connection electrodes 71 to 73. In this case, the first electrode film 75 and the second electrode film 76 of the plurality of first to third connection electrodes 71 to 73 are formed by the first electrode film 85 and the second electrode film 86 of the gate pad electrode 81 (the gate wiring electrode 82).

The example in which the source pad electrode 83 separate from the plurality of fourth connection electrodes 74 is formed has been described in each of the above-described embodiments. However, a portion of the source pad electrode 83 may be buried in the interlayer insulating film 61, as the plurality of fourth connection electrodes 74. In this case, the first electrode film 75 and the second electrode film 76 of the plurality of fourth connection electrodes 74 are formed by the first electrode film 85 and the second electrode film 86 of the source pad electrode 83.

The example in which the source pad electrode 83 separate from the plurality of buried electrodes 53 is formed has been described in each of the above-described embodiments. However, a portion of the source pad electrode 83 may be buried in the plurality of contact holes 51, as the plurality of buried electrodes 53. In this case, the first electrode film 54 and the second electrode film 55 of each buried electrode 53 are formed by the first electrode film 85 and the second electrode film 86 of the source pad electrode 83.

In each of the above-described embodiments, the p-type semiconductor portion may be an n-type semiconductor portion, and the n-type semiconductor portion may be a p-type semiconductor portion. In this case, in the description of each of the above-described embodiments, the "n-type" portion is read as "p-type" and the "p-type" portion is read as "n-type." Although the embodiments of the present disclosure have been described in detail, these are merely specific examples used to clarify technical contents of the present disclosure. The present disclosure should not be construed as being limited to these specific examples, and the scope of the present disclosure is limited by the appended claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
  a semiconductor chip; and
  a field effect transistor formed on the semiconductor chip and including a plurality of unit cells, which include at least one first unit cell including a first on-resistance component and a first feedback capacitance component and at least one second unit cell including a second on-resistance component forming a parallel component with respect to the first on-resistance component and exceeding the first on-resistance component and a second feedback capacitance component forming a parallel component with respect to the first feedback capacitance component and being less than the first feedback capacitance component.

2. The semiconductor device of claim 1, further comprising at least one active region set in the semiconductor chip,
  wherein the at least one first unit cell and the at least one second unit cell are formed in the at least one active region.

3. The semiconductor device of claim 2, wherein the at least one active region includes a single active region set in the semiconductor chip.

4. The semiconductor device of claim 1, wherein the at least one first unit cell extends in a stripe shape, and
  wherein the at least one second unit cell extends in a stripe shape in a direction which is the same as that of the at least one first unit cell.

5. The semiconductor device of claim 1, wherein the at least one first unit cell extends in a stripe shape, and
  wherein the at least one second unit cell extends in a stripe shape in a direction different from that of the at least one first unit cell.

6. The semiconductor device of claim 1, wherein the at least one first unit cell includes a plurality of first unit cells.

7. The semiconductor device of claim 1, wherein the at least one second unit cell includes a plurality of second unit cells.

8. The semiconductor device of claim 1, wherein the at least one first unit cell includes:
  a first gate structure including a first upper electrode and a first lower electrode buried in a vertical direction with a first insulator interposed therebetween in a first trench formed on the semiconductor chip, a gate potential being applied to both of the first upper electrode and the first lower electrode; and
  a first channel formed adjacent to the first gate structure on a surface layer of the semiconductor chip and controlled by the first upper electrode, and
  wherein the at least one second unit cell includes:
  a second gate structure including a second upper electrode and a second lower electrode buried in the vertical direction with a second insulator interposed therebetween in a second trench formed on the semiconductor chip, the gate potential being applied to the second upper electrode and a source potential being applied to the second lower electrode; and
  a second channel formed adjacent to the second gate structure on the surface layer of the semiconductor chip and controlled by the second upper electrode.

9. The semiconductor device of claim 8, further comprising:
  an interlayer insulating film that covers the at least one first unit cell and the at least one second unit cell;
  a gate pad formed on the interlayer insulating film;
  a gate wiring that is drawn out from the gate pad onto the interlayer insulating film to intersect the at least one first unit cell and the at least one second unit cell in a plan view, and is electrically connected to the first upper electrode, the first lower electrode, and the second upper electrode; and
  a source pad that is formed on the interlayer insulating film and is electrically connected to the second lower electrode.

10. The semiconductor device of claim 9, further comprising:
  a first connection electrode that is buried in the interlayer insulating film and is electrically connected to the first upper electrode;
  a second connection electrode that is buried in the interlayer insulating film and is electrically connected to the first lower electrode;
  a third connection electrode that is buried in the interlayer insulating film and is electrically connected to the second upper electrode; and
  a fourth connection electrode that is buried in the interlayer insulating film and is electrically connected to the second lower electrode,
  wherein the gate wiring is connected to the first connection electrode, the second connection electrode, and the third connection electrode, and
  wherein the source pad is electrically connected to the fourth connection electrode.

11. The semiconductor device of claim 10, wherein the first connection electrode overlaps the first gate structure in a plan view,
  wherein the second connection electrode overlaps the first gate structure in a plan view,
  wherein the third connection electrode overlaps the second gate structure in a plan view, and
  wherein the fourth connection electrode overlaps the second gate structure in a plan view.

12. The semiconductor device of claim 10, wherein the first gate structure includes a first lead-out electrode formed of a portion of the first lower electrode and drawn out to the side of an opening of the first trench while being interposed in the first insulator,
  wherein the second gate structure includes a second lead-out electrode formed of a portion of the second lower electrode and drawn out to the side of an opening of the second trench while the second insulator being interposed,
  wherein the second connection electrode is connected to the first lead-out electrode, and
  wherein the fourth connection electrode is connected to the second lead-out electrode.

13. A semiconductor device, comprising:
  a semiconductor chip having a main surface;
  a first conductive type drift region formed on a surface layer of the main surface;

a second conductive type body region formed on a surface layer of the first conductive type drift region;

at least one first gate structure including a first upper electrode and a first lower electrode buried in a vertical direction with a first insulator interposed in a first trench formed on the main surface so as to penetrate the second conductive type body region;

at least one second gate structure including a second upper electrode and a second lower electrode buried in the vertical direction with a second insulator interposed in a second trench formed on the main surface so as to penetrate the second conductive type body region;

a first conductive type first source region that is formed in a region along the at least one first gate structure in a surface layer of the second conductive type body region such that a first channel is formed between the first conductive type drift region and the first conductive type first source region; and a first conductive type second source region that is formed in a region along the at least one second gate structure in the surface layer of the second conductive type body region such that a second channel is formed between the first conductive type drift region and the first conductive type second source region, wherein a gate potential is applied to both of the first upper electrode and the first lower electrode, and wherein the gate potential is applied to the second upper electrode and a source potential is applied to the second lower electrode.

14. The semiconductor device of claim 13, wherein the at least one first gate structure extends in one direction along the main surface, and wherein the at least one second gate structure extends in an intersection direction that intersects in the one direction.

15. The semiconductor device of claim 14, wherein the at least one second gate structure faces the at least one first gate structure in the intersection direction.

16. The semiconductor device of claim 14, wherein the at least one second gate structure faces the at least one first gate structure in the one direction.

17. The semiconductor device of claim 13, further comprising:

an interlayer insulating film that covers the at least one first gate structure and the at least one second gate structure;

a gate wiring that is formed on the interlayer insulating film, extends so as to intersect the at least one first gate structure and the at least one second gate structure in a plan view, and is electrically connected to the first upper electrode, the first lower electrode, and the second upper electrode; and a source pad that is formed on the interlayer insulating film at an interval from the gate wiring and is electrically connected to the second lower electrode.

18. The semiconductor device of claim 17, further comprising a gate pad that is formed on the interlayer insulating film and is connected to the gate wiring.

19. The semiconductor device of claim 13, wherein the at least one first gate structure includes a plurality of first gate structures; and wherein the at least one second gate structure includes a plurality of second gate structures.

* * * * *